(12) United States Patent
Okubo et al.

(10) Patent No.: US 9,634,261 B2
(45) Date of Patent: Apr. 25, 2017

(54) ORGANIC PHOTOELECTRIC CONVERSION ELEMENT AND SOLAR CELL USING SAME

(75) Inventors: Yasushi Okubo, Hino (JP); Kunio Tani, Hachioji (JP)

(73) Assignee: KONICA MINOLTA INC., Tokyo (JP)

( * ) Notice: Subject to any disclaimer, the term of this patent is extended or adjusted under 35 U.S.C. 154(b) by 798 days.

(21) Appl. No.: 13/805,832

(22) PCT Filed: Jun. 23, 2011

(86) PCT No.: PCT/JP2011/064379
§ 371 (c)(1),
(2), (4) Date: Dec. 20, 2012

(87) PCT Pub. No.: WO2012/002246
PCT Pub. Date: Jan. 5, 2012

(65) Prior Publication Data
US 2013/0098449 A1    Apr. 25, 2013

(30) Foreign Application Priority Data

Jul. 2, 2010 (JP) ................................. 2010-151746

(51) Int. Cl.
*H01L 51/00* (2006.01)
*H01L 51/42* (2006.01)
*B82Y 10/00* (2011.01)

(52) U.S. Cl.
CPC .......... *H01L 51/0072* (2013.01); *B82Y 10/00* (2013.01); *H01L 51/002* (2013.01);
(Continued)

(58) Field of Classification Search
None
See application file for complete search history.

(56) References Cited

U.S. PATENT DOCUMENTS

| | | | |
|---|---|---|---|
| 2011/0028644 A1* | 2/2011 | Brown et al. | 524/606 |
| 2011/0037064 A1* | 2/2011 | Mueller | H01L 51/0043 257/40 |

(Continued)

FOREIGN PATENT DOCUMENTS

| | | |
|---|---|---|
| JP | 2008-255097 A | 10/2008 |
| JP | 2009-146981 A | 7/2009 |
| JP | 2010-258143 A | 11/2010 |
| WO | 2010/038721 A1 | 4/2010 |
| WO | 2010/104042 A1 | 9/2010 |

OTHER PUBLICATIONS

Quingshuo Wei et al., "Self-Organized Buffer Layers in Organic Solar Cells", Advanced Materials 2008, 20, 1-6.
(Continued)

*Primary Examiner* — Jennifer Michener
*Assistant Examiner* — Christopher Danicic
(74) *Attorney, Agent, or Firm* — Cantor Colburn LLP

(57) ABSTRACT

Disclosed is an organic photoelectric conversion element which has a reverse layer structure wherein at least a first electrode, a photoelectric conversion layer and a second electrode are arranged on a substrate in this order. The organic photoelectric conversion element is characterized in that: the photoelectric conversion layer is a bulk heterojunction layer that is composed of a p-type organic semiconductor material and an n-type organic semiconductor material; and a compound that has a linear or branched fluorinated alkyl group having 6-20 carbon atoms is contained as the p-type organic semiconductor material.

27 Claims, 2 Drawing Sheets

(52) U.S. Cl.
CPC ...... *H01L 51/0043* (2013.01); *H01L 51/4253* (2013.01); *H01L 51/0036* (2013.01); *H01L 51/0047* (2013.01); *H01L 51/0094* (2013.01); *Y02E 10/549* (2013.01)

(56) References Cited

U.S. PATENT DOCUMENTS

| | | | |
|---|---|---|---|
| 2011/0042652 A1* | 2/2011 | Meng | 257/40 |
| 2011/0068328 A1* | 3/2011 | Koenemann | C09B 5/62 257/40 |

OTHER PUBLICATIONS

M.S. White et al., "Inverted bulk-heterojunction organic photovoltaic device using a solution-derived ZnO underlayer", Appl.Physlett. 89, http://dx.doi.org/10.1063/1.2359579.

J. Peet et al., "Efficiency enhancement in low-bandgap polymer solar cells by processing with alkane dithiols", Nature Materials, vol. 6, Jul. 2007, pate 497-500.

Jianchang Guo et al, Structure, Dynamics, and Power Conversion Efficiency Correlations in a New Low Bandgap Polymer: PCBM Solar Cell, J. Phys. Chem. B2010, vol. 114, p. 742-748.

International Search Report for International application No. PCT/JP2011/064379 mailing date of Jul. 26, 2011 with English translation.

* cited by examiner

ORGANIC PHOTOELECTRIC CONVERSION ELEMENT AND SOLAR CELL USING SAME

CROSS REFERENCE TO RELATED APPLICATIONS

This is a U.S. national stage of application No. PCT/JP2011/064379, filed on 23 Jun. 2011. Priority under 35 U.S.C. §119(a) and 35 U.S.C. §365(b) is claimed from Japanese Application No. 2010-151746, filed 2 Jul. 2010, the disclosure of which is also incorporated herein by reference.

TECHNICAL FIELD

The present invention relates to an organic photoelectric conversion element and a solar cell, and, in more detail, relates to a bulk heterojunction-type organic photoelectric conversion element and a solar cell employing this organic photoelectric conversion element.

BACKGROUND

Due to the steep rise of fossil energy price in recent years, required has been the system which can generate electric power directly from natural energy. To respond such requirement, it has been proposed or put to practical use a solar cell using Si in a single crystal, a polycrystalline state, or an amorphous state, a solar cell made of a compound of GaAs or CIGS (namely, a semiconductor material containing copper (Cu), indium (In), gallium (Ga) and Selenium (Se)), or a dye sensitized photoelectric conversion element (Gratzel cell).

However, the cost of electric power generation with these solar cells is still higher than the price of electricity generated and transmitted using the fossil fuel, and it has been an obstacle for the spread of solar cells. Moreover, it has been needed to use a heavy glass as a substrate, and a reinforcement work has been required at the time of installation. This has also been a cause which increases the cost of electric power generation.

Under such circumstances, it was proposed a bulk heterojunction-type photoelectric conversion element as a solar cell which can achieve lower electric generating cost than the electric generating cost using a fossil fuel. In this photoelectric conversion element, there is a photoelectric conversion layer, in which an electron donor layer (p-type semiconductor layer) and an electron acceptor layer (n-type semiconductor layer) are mixed, sandwiched between an anode and cathode (for example, refer to Non-patent document 1). In this solar cell, an efficiency of 5% or more has been reported.

In these bulk heterojunction-type solar cells, the composing members are formed with a coating process except for an anode and a cathode. Therefore, it is expected that high-speed and low cost production is possible, and the problems of the above-mentioned electric power generation cost may be overcome. Furthermore, unlike the above-mentioned Si system solar cell, the compound semiconductor system solar cell, and the dye-sensitized solar cell, there is no high temperature process above 160° C. Therefore, it is expected that formation of a cell on a low cost and lightweight plastic substrate is also possible.

On the other hand, durability is also required for a solar cell. However, the durability of an organic thin film solar battery is still insufficient, and the improvement is still expected.

In view of the foregoing problems, an organic thin film solar cell having a so called reverse layer structure in which elections are taken out from the transparent electrode side and positive holes are taken out from the side of the stable metal electrode having a deep work function by laminating the element in a reversed order to the lamination order of a usual organic thin film solar cell (refer to Patent Document 1 and Non-Patent document 2).

It has been disclosed that, by using such a construction, a notably improved durability of a solar cell can be attained by suppressing the deterioration originated from the electrode, since there is no need to use a metal electrode having a smaller work function, which is unstable and easy to be oxidized.

The photoelectric conversion efficiency ($\eta$) of an organic thin film solar cell is expressed by the following formula. It is necessary to improve each of open circuit voltage (Voc), a short-circuit current density (Jsc), and a fill factor (FF) for improvement in the efficiency of a solar cell.

Photoelectric conversion efficiency (%)=open circuit voltage (V)×short circuit current density (mA/in$^2$)×fill factor (FF)

However, in the reverse layer type organic thin film solar cell as disclosed by such as the above mentioned Patent Document 1 and Non-Patent document 2, the fill factor was as low as 0.52 which had been a problem to improve the efficiency.

The FF value has a correlation with the electrical property of a solar cell as a diode, and the following properties are desired to improve the FF value.

1) The resistance is large when a reverse bias is applied. (The parallel resistance is large.)
2) The resistance is small when a forward bias is applied. (The series resistance is small.)

As a useful method to increase the resistance when a reverse bias is applied, for both, a method to provide a concentration gradient has been considered, namely, to provide a structure in which a p-type organic semiconductor material is eccentrically located near the electrode from which positive holes are taken out (anode) and an n-type organic semiconductor material is eccentrically located near the electrode from which electrons are taken out (cathode).

In such a structure, a low resistance diode can be obtained since occurrence of charge injection barrier is avoided. Such charge injection barrier may occur when an n-type organic semiconductor material becomes in contact with the anode or when a p-type organic semiconductor material becomes in contact with the cathode, which tends to occur in a usual bulk heterojunction layer. In contrast, when a reverse bias is applied, the region where an n-type organic semiconductor material is in contact with the anode or the region where a p-type organic semiconductor material is in contact with the cathode gives a region where leak tends to occur. Accordingly, the structure in which aforementioned concentration gradient is formed can provide a larger resistance when a reverse bias is applied, in the same way.

In a forward layer structure, a method as disclosed in Non-Patent Document 3 has been disclosed as a method to form a bulk heterojunction layer having an ideal concentration gradient.

Namely, it is designed so that the n-type organic semiconductor material is spontaneously located eccentrically near the cathode by mixing a fullerene derivative which has an alkyl fluoride group exhibiting a very low surface energy. According to such a method, a fill factor of 0.70 has been obtained.

However, in the method of Non-Patent Document 3, it is necessary to use a metal having a small work function as an electrode. Accordingly, a problem that the durability is low has been left unsolved. Also, another problem has been left unresolved, namely, even when this composition is used in a reverse layer structure, a high photoelectric conversion efficiency cannot be obtained since the preferred direction of the concentration gradient cannot be obtained.

Also, for further improvement in the fill factor, it is necessary to lower the resistance while a forward bias is applied (a series resistance). This problem has correlation with the mobility in the bulk heterojunction layer. It is said that the carrier in an organic semiconductor material is conducted in the stacking direction of the π planes. In Non-Patent Document 4, it is disclosed that the guideline to obtain a high photoelectric conversion efficiency is that the π planes are stacked in parallel with the electrode in a forward layer structure.

However, there has been no guideline with respect to the molecular design to stack the π planes in parallel with the electrode plane. Accordingly, a proposal of a means to stack the π planes in parallel with the electrode plane has been desired.

On the other hand, in Patent Document 2, a π-conjugated compound incorporated with an alkyl fluoride group is used in a forward layer structure as an n-type organic semiconductor material exhibiting an excellent electron conducting property.

However, such a material has been difficult to use in a reverse layer structure since the preferred direction of the concentration gradient becomes inverse in a reverse layer structure. Thus, a material which enables spontaneous formulation of concentration gradient even in a reverse layer structure in the same way has been desired.

In addition, in Patent Document 2, a photoelectric conversion element containing P3HT and fluorine-containing semiconductor material has been disclosed. However, the fluorine-containing semiconductor material is used as an n-type organic semiconductor material as well as the element construction is a forward layer structure, whereby no idea to improve the fill factor of reverse layer structure has been disclosed. Further, the photoelectric conversion efficiency remained low.

PRIOR ART DOCUMENTS

Patent Documents
Patent Document 1: Japanese Patent Application Publication Open to Public Inspection (hereafter referred to as JP-A) No. 2009-146981
Patent Document 2: JP-A No. 2008-255097
Non-Patent Documents
Non-Patent Document 1: Nature Mat., vol. 6 (2007), p 497, A. Heeger, etc.
Non-Patent Document 2: APPLIED PHYSICS LETTERS 89, p 143517, NREL Shaheen, etc.
Non-Patent Document 3: Adv. Mater. 2008, 20, p 1, Hashimoto, Tajima etc.
Non-Patent Document 4: J. Phys. Chem. B (2010), v 114, p 742, Luping Yu, etc.

SUMMARY OF THE INVENTION

Problems to be Solved by the Invention

An object of the present invention is to provide an organic photoelectric conversion element exhibiting high durability and a high photoelectric conversion efficiency, and, for this purpose, to improve the low photoelectric conversion efficiency which has been considered as a drawback of a photoelectric conversion element of a reverse layer structure which has been known to exhibit high durability.

By applying the method disclosed in Non-Patent Document 3, the present inventors have tested to improve the fill factor to improve the photoelectric conversion efficiency by providing a concentration gradient in the organic semiconductor. However, the concentration gradient of Non-Patent Document 3 is in the opposite direction to the direction of the concentration gradient preferred in a reverse layer structure. Accordingly, it was difficult to use as it was. Thus, a material which enables spontaneous formation of concentration gradient in the same way even in a reverse layer structure has been desired.

In view of the foregoing problems, the present invention was achieved. An object of the present invention is to provide an organic photoelectric conversion element exhibiting a high fill factor and a high photoelectric conversion efficiency, among reverse layer structure type organic photoelectric conversion elements exhibiting a high photoelectric conversion efficiency and high durability, and to provide a solar cell employing the same.

Means to Solve the Problems

The present inventors have found that, in a reverse layer structure, the p-type organic semiconductor material locates eccentrically near the counter electrode to provide a concentration gradient preferred for the reverse layer structure by adding a fluorinated alkyl group having 6 or more carbon atoms to a p-type organic semiconductor material. Further, when a fluorinated alkyl group of a branched chain is used, the π conjugated plane of the p-type organic semiconductor material tends to be arranged parallel to the electrode plane since, while the fluorinated alkyl group is oriented on the gas-liquid interface, the branched chain is not oriented, whereby the formation of a preferred concentration gradient in the bulk heterojunction layer and reduction of the series resistance are both achieved.

The above object of the present invention was achieved by the following structures.

1. An organic photoelectric conversion element having a reverse layer structure comprising a substrate having thereon at least a first electrode, a photoelectric conversion layer and a second electrode in this order, wherein
the photoelectric conversion layer is a bulk heterojunction layer comprising a p-type organic semiconductor material and an n-type organic semiconductor material, and
the p-type organic semiconductor material comprises a compound that has a linear or branched fluorinated alkyl group having 6 to 20 carbon atoms.

2. The organic photoelectric conversion element of Item 1, wherein the fluorinated alkyl group has 8 to 20 carbon atoms.

3. The organic photoelectric conversion element of Item 1 or 2, wherein the fluorinated alkyl group is represented by Formula (1)

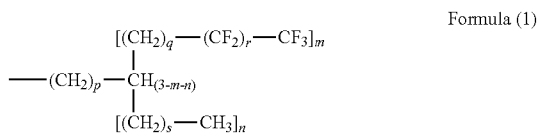

Formula (1)

wherein p, q, r, s=0 to 20, m=1 to 3, n=0 to 2, 1≤m+n≤3, and each represents an integer.

4. The organic photoelectric conversion element of Item 3, wherein Formula (1) meets 3≥m+n≥2.

5. The organic photoelectric conversion element of Item 3 or 4, wherein Formula (1) meets m≥1 and n≥1.

6. The organic photoelectric conversion element of any one of Items 1 to 5, wherein the compound having the fluorinated alkyl group has a substructure represented by Formula (2):

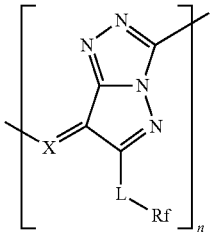

Formula (2)

wherein Rf represents the linear or branched fluorinated alkyl group having 6 to 20 carbon atoms, X represents an atom selected from CH and N, and L represents a single bond or a divalent connecting group.

7. The organic photoelectric conversion element of Item 6, wherein, in Formula (2), L represents a carbonyl group, an ester group or an amide group.

8. The organic photoelectric conversion element of Item 6 wherein, in Formula (2), L represents an ester group.

9. The organic photoelectric conversion element of any one of Items 1 to 8, wherein at least one fluorinated alkyl group has 7 to 17 fluorine atoms.

10. The organic photoelectric conversion element of any one of Items 1 to 9, wherein the compound having the fluorinated alkyl group is a copolymer of a monomer having the fluorinated alkyl group and a monomer having a common mother moiety with the monomer having the fluorinated alkyl group and having no fluorinated alkyl group.

11. The organic photoelectric conversion element of any one of Items 1 to 10, wherein the bulk heterojunction layer is formed via a wet process.

12. A solar cell comprising the organic photoelectric conversion element of any one of Items 1 to 11.

Effect of the Invention

According to the present invention, an organic photoelectric conversion element exhibiting a high photoelectric conversion efficiency and high durability, and a solar cell and a photo array sensor employing the organic photoelectric conversion element could be provided.

EMBODIMENTS TO CARRY OUT THE INVENTION

The present invention will be described in detail below.

The organic photoelectric conversion element of the present invention has a feature that the photoelectric conversion layer contains a compound which has a linear or branched fluorinated alkyl group having 6 or more carbon atoms as an aforementioned p-type organic semiconductor material.

The present invention will now be described in further detail below.

(Construction of Organic Photoelectric Conversion Element and Solar Cell)
(Forward Layer Structure)

Figure 1:
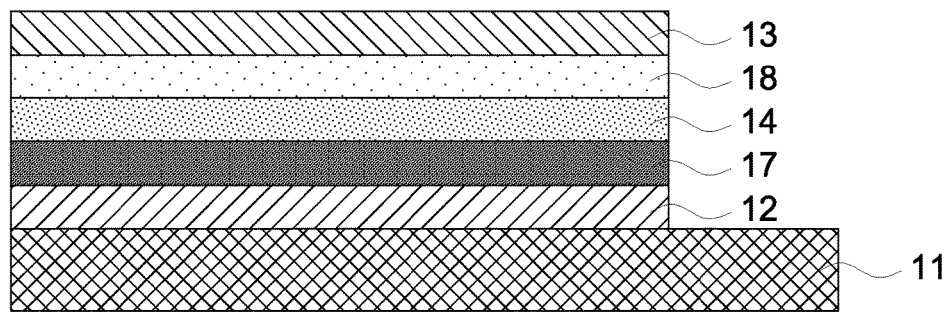
FIG. 1 is a sectional drawing showing an organic photoelectric conversion element of forward layer structure.

FIG. 1 is a sectional drawing showing a bulk heterojunction-type organic photoelectric conversion element of a forward layer structure. In FIG. 1, an organic photoelectric conversion element 10 of a bulk heterojunction-type is formed by sequentially stacking transparent electrode (usually an anode) 12, hole transport layer 17, photoelectric conversion layer 14, electron transport layer 18 and counter electrode (usually a cathode) 13 on one surface of substrate 11.

In a construction having a photoelectric conversion layer between a transparent electrode and a counter electrode, the aforementioned forward layer structure refers to a construction in which the transparent electrode works as an anode and the counter electrode works as a cathode, and the construction in which a positive hole generated in the photoelectric conversion layer flows into the first electrode 12 and an electron generated in the photoelectric conversion layer flows into the second electrode 13.

The substrate 11 is a member which holds the first electrode 12, the photoelectric conversion layer 14, and the second electrode 13 that were laminated sequentially. It is preferable, in the present embodiment, that the light to be subjected to photoelectric conversion enters from the substrate 11 side. Accordingly, the substrate 11 and the first electrode 12 are preferably possible to transmit the light to be subjected to photoelectric conversion, namely, the substrate 11 and the first electrode 12 are preferably transparent with respect to the light to be photoelectrically converted. For example, a glass substrate and a resin substrate may be used preferably for the substrate 11. This substrate 11 is not indispensable, and, for example, a bulk heterojunction-type organic photoelectric conversion element 10 may be constructed by forming a first electrode 12 and a second electrode 13 which is a counter electrode on both surfaces of a photoelectric conversion layer 14.

In FIG. 1, the photoelectric conversion layer 14 is a layer which transforms light energy into electric energy, and is constructed by having a photoelectric conversion layer in which a p-type organic semiconductor material and an n-type organic semiconductor material are mixed uniformly. A p-type organic semiconductor material functions as an electron donating material (donor) relatively, and an n-type organic semiconductor material functions as an electron accepting material (acceptor) relatively.

The electron donor and the electron acceptor means an electron donor and an electron acceptor, in which, an electron is transferred from the electron donor to the electron acceptor to form a pair of a positive hole and an electron (namely, forming a charge separation state), "when light is absorbed". That is, the electron donor and the electron acceptor donates or accepts an electron via a photoreaction, therefore they are different from the electrodes which merely donate or accept an electron.

In FIG. 1, the light which entered from the first electrode 12 through the substrate 11 is absorbed by an electron acceptor or an electron donor in the photoelectric conversion layer of the photoelectric conversion layer 14, and, then, an electron moves from the electron donor to the electron acceptor to form a pair of positive hole and electron (namely, charge separation occurs). The generated charge is conveyed in the direction of an internal electric field. The internal electric field is determined according to the work function levels of the conductors nearest to both the ends of the photoelectric conversion layer 14. Therefore, for example, if the work function of the first electrode 12 is larger than the work function of the second electrode 13, when the work functions of the first electrode 12 and the second electrode 13 are compared, a positive hole will be conveyed to the direction of the first electrode 12. In the present invention, the work function is discussed with an absolute value. When PEDOT:PSS which has conductivity is used for the hole transport layer 17, the difference of the work function of this hole transport layer 17 and the work function of the second electrode 13 corresponds serves as an internal electric field. In this case, when the work functions of the hole transport layer 17 and the counter electrode 13 differ, an electron migrates among electron acceptors, and a positive hole migrates among electron donors, and, then, these carriers are conveyed to respective electrodes by the electric potential difference of the hole transport layer 17 and the counter electrode 13, whereby photocurrent is detected with it.

Here, making the work function of the second electrode 13 smaller than the work function of the hole transport layer 17 means that it is necessary to use a metal having a small work function and being easy to be oxidized for the second electrode 13. When this metal is oxidized, conductivity is lost, or the work function becomes large, resulting in deterioration of the electric property of the element due to notable increase in the contact resistance between the layers. This has been a major reason of the poor durability of a photoelectric conversion element of a forward layer structure.

(Reverse Layer Structure)

In a construction having a photoelectric conversion layer between a transparent electrode and a counter electrode, the aforementioned reverse layer structure refers to a construction in which the transparent electrode works as a cathode and the counter electrode works as an anode, and the construction in which an electron generated in the photoelectric conversion layer flows into the first electrode and a positive hole generated in the photoelectric conversion layer flows into the second electrode.

Figure 2:
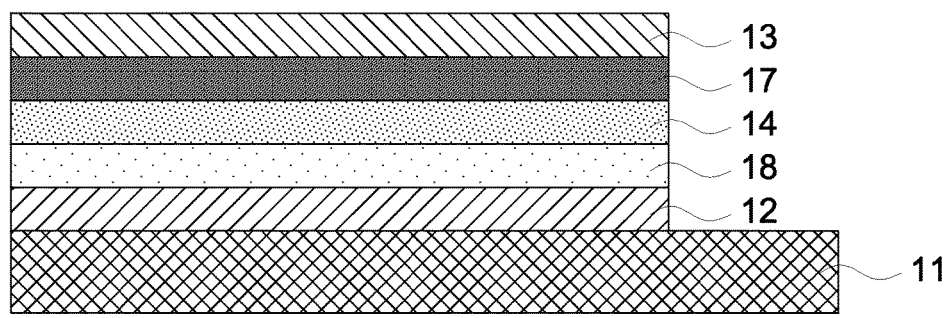
FIG. 2 is a sectional drawing showing an organic photoelectric conversion element of reverse layer structure.

In FIG. 2, an example of a construction of an organic photoelectric conversion element of the reverse layer structure is shown. In FIG. 2, a first electrode 12 which is a transparent electrode, an electron transport layer 18, a photoelectric conversion layer 14, a hole transport layer 17, and a second electrode 13 which is a counter electrode are sequentially stacked on a substrate 11. The first electrode 12 works as the cathode and the second electrode 13 works as the anode. In the reverse layer structure of the present invention, the work function of the anode is made larger than the work function of the first electrode 12 which is a cathode, whereby an electron can be conveyed to the first electrode and a positive hole can be conveyed to the second electrode 13. Namely, a reverse layer structure refers to the construction of an organic photoelectric conversion element having an electric field opposite to the electric field of the aforementioned forward layer construction.

As mentioned above, the internal electric field is determined according to the work function levels of the conductors nearest to both the ends of the photoelectric conversion layer 14. Therefore, if the conductors nearest to both the ends of the electric generation layer are the first electrode 12 and the second electrode 13, the internal electric field is determined by the work functions of the first electrode 12 and the second electrode 13, and, when, for example, a conductive PEDOT:PSS is used for the hole transport layer 17, the internal electric field is determined by the work functions of the first electrode 12 and the hole transport layer 17.

Namely, by employing an organic photoelectric conversion element of a reverse layer structure in which the positions of the hole transport layer 17 and the electron transport layer 18 in FIG. 1 are exchanged to those in FIG. 2, a metal which has a large work function, and is stable and not easily oxidized can be used for the second electrode 13. As the result, deterioration of the organic photoelectric conversion element due to the oxidation of the second electrode can be avoided, whereby stabilization of the element can be achieved.

Although not shown in FIG. 1 and FIG. 2, other layers, such as a hole blocking layer, an electronic blocking layer, an electron injection layer, a hole injection layer, or a smoothing layer may further be used.

(Tandem Construction)

Figure 3:
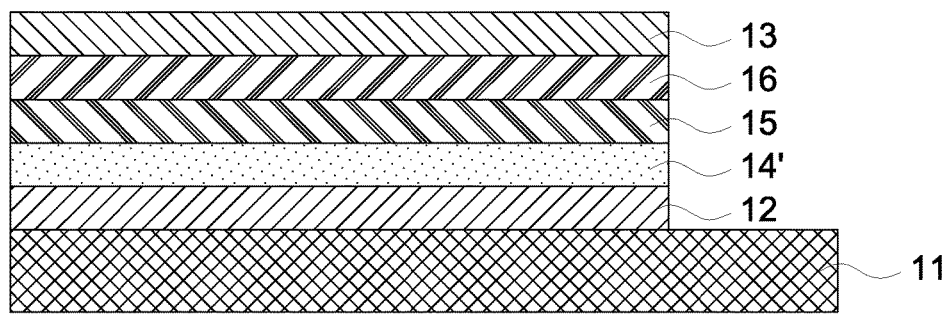
FIG. 3 is a sectional drawing showing an organic photoelectric conversion element equipped with a tandem type photoelectric conversion layer.

Further, in order to improve the sunlight utilization rate (the photoelectric conversion efficiency), a tandem type construction in which such organic photoelectric conversion elements are attacked may be employed. FIG. 3 is a sectional drawing showing an organic photoelectric conversion element equipped with a tandem type photoelectric conversion layer.

A tandem type structure can be made as follows. After laminating a first electrode 12 and a first photoelectric conversion layer 14' sequentially on a substrate 11, a charge recombination layer 15 is laminated. Then, a second photoelectric conversion layer 16 and a second electrode 13 are laminated to achieve a tandem type construction. The second photoelectric conversion layer 16 may be a layer which absorbs the same spectrum as an absorption spectrum of the first photoelectric conversion layer 14', or it may be a layer which absorbs a different spectrum. Preferably, the second photoelectric conversion layer 16 absorbs a different spectrum from that of the first photoelectric conversion layer 14'.

A hole transport layer 17 or an electron transport layer 18 may be provided between the first photoelectric conversion layer 14' or the second photoelectric conversion layer 16 and respective electrodes. In the present invention, even in a tandem construction, each of the photoelectric conversion layers 14' and 16 preferably has a reverse layer structure, as shown in FIG. 2.

The materials constructing these layers will now be described below.

[A p-Type Organic Semiconductor Material]

In the present invention, the p-type organic semiconductor material has a feature that it contains a compound having a linear or branched fluorinated alkyl group having 6 or more carbon atoms.

As described above, it was found that, in a reverse layer structure, by adding an alkyl fluoride group having 6 or more carbon atoms to a p-type organic semiconductor material, the p-type organic semiconductor material becomes located eccentrically on the counter electrode side to provide a concentration gradient preferable for a reverse layer structure, whereby improve in the fill factor becomes possible.

Here, the number of carbon atoms represents the number of carbon atoms of a monovalent substituent including and after the carbon atom bonded to the ring, when the alkyl group is directly bonded to the ring structure of the mother moiety, and represents the number of carbon atoms of a monovalent substituent farer to the connecting group, when the alkyl group is bonded to the ring structure via a connecting group, irrespective of the case of a straight chain or a branched chain. For example, the number of carbon atom is 1 for a methyl group, 4 for a t-butyl group, and 8 for an ethylhexyl group. Even in the case of an alkyl group of which all the hydrogen atoms are fluorinated (namely, a perfluoroalkyl group) such as 1,1,1,2,2,3,3-perfluoropropyl group or an alkyl group of which hydrogen atoms are partially replaced with fluorine (namely a hemifluoroalkyl group) such as 1,1,1-trifluoropropyl group, the number of carbon atoms is respectively 3.

Among such alkyl groups or a fluorinated alkyl groups, such an effect is observed when the number of carbon atoms of these groups becomes 6 or more. The reason of this is assumed to be as follows: a packing effect by the alkyl groups generally occurs when the number of carbon atoms becomes 6 or more, and, even when fullerenes or other p-type organic semiconductor materials (the alkyl group of these materials are often substituted to provide a dissolving nature) existing in the coating solution of the bulk heterojunction layer are present, a low surface energy state with which the alkyl group can be oriented on the gas-liquid interface in the coating process can be obtained, when the number of carbon atoms becomes 6 or more.

The number of carbon atoms is more preferably 8 or more, and further more preferably 12 or more. On the other hand, the number of carbon atoms is preferably 20 or less, since the ratio of the aromatic portion which contributes to convey the carrier generated by the photo voltaic power becomes low, when the number of carbon atoms is too large. The number of carbon atoms is preferably 18 or less.

The number of fluorine atoms is preferably from 5 to 21. When the number of fluorine atoms is 5 or more, the power to orient on the gas-liquid surface is increased, while, when the number of fluorine atoms is 21 or less, the surface energy of the surface of the bulk heterojunction layer becomes a suitable level, whereby a layer having a uniform thickness can be formed when another layer is formed on the bulk heterojunction layer. Since an alkyl group substituted by many fluorine atoms tends to be expensive, the number of fluorine atoms is preferably 17 or less in view of the cost. Further, the number of fluorine atoms is preferably 7 or more, because the power of the alkyl group to arrange on the gas-liquid interface is increased.

On the other hand, the fluorinated alkyl group has a problem that it is rigid and has a lower solubility when compared with those of an alkyl group which is not substituted with fluorine. Specifically, the solubility tends to become further lower, when the portion which is directly bonded to the mother moiety of the p-type organic semiconductor material is rigid. Accordingly, preferably employed is a hemifluoroalkyl group such as represented by Formula (1), which is an alkyl group of which the portion which is directly bonded to the mother moiety of the p-type organic semiconductor material is not fluorinated

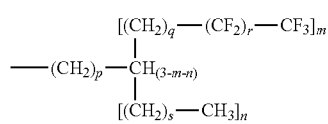

Formula (1)

wherein p, q, r, s=0 to 20, m=1 to 3, n=0 to 2, 1≤m+n≤3, and each represents an integer.

In order to provide further higher solubility, it is preferable to use a branched chain alkyl group. Namely, preferable is a branched chain fluorinated alkyl group which meets 3≥m+n≥2 in Formula (1).

As a compound having a substituent represented by Formula (1), the following Compound P as a model compound will be cited to explain the mechanism of orientation.

Compound P

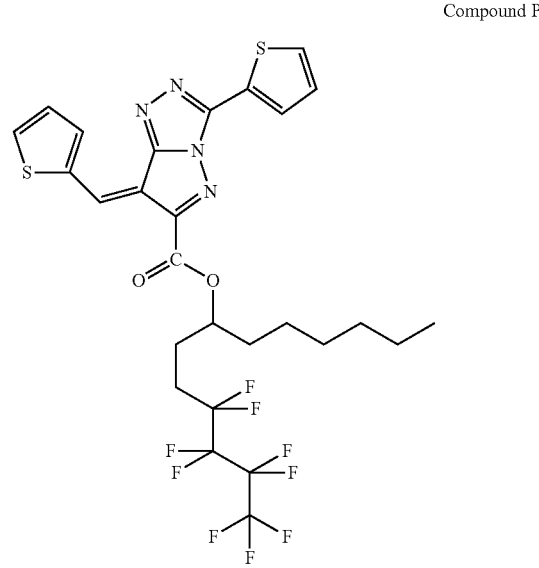 [SMILES: CCCCCCC(CCC(F)(F)C(F)(F)C(F)(F)C(F)(F)F)OC(=O)c1nn2c(-c3cccs3)nnc2/c1=C\c1cccs1]

Figure 4:
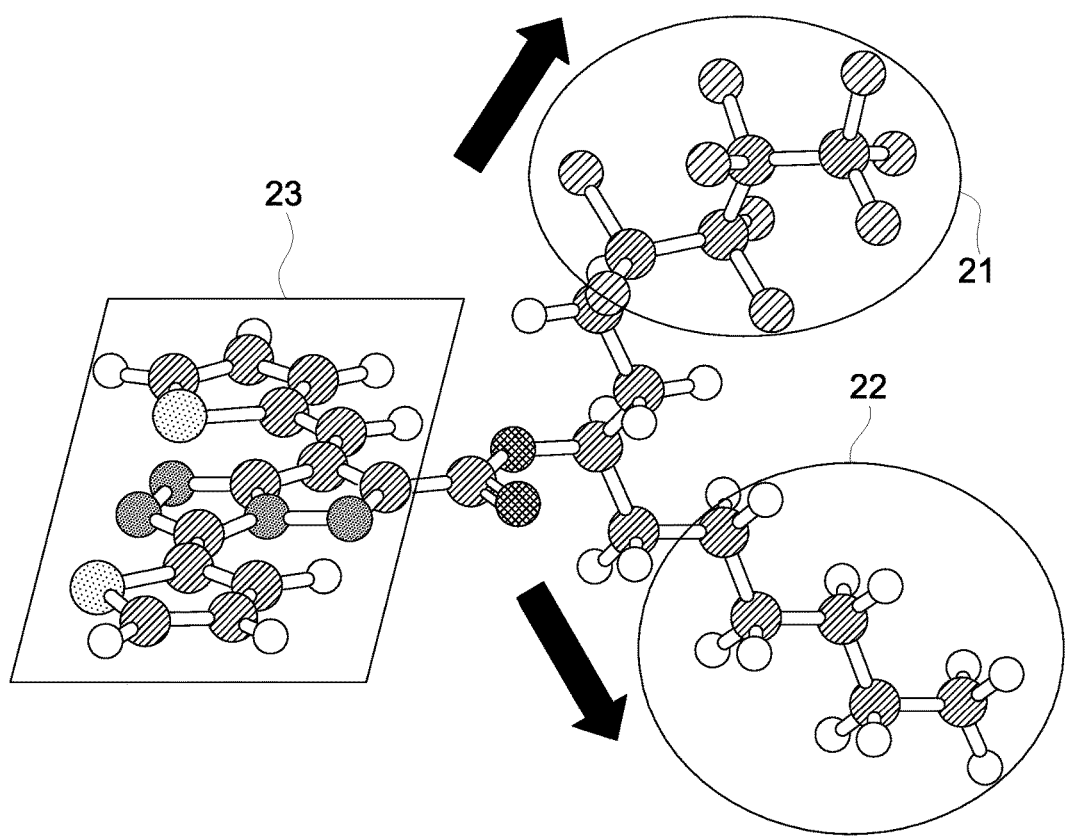
FIG. 4 is a figure showing the orientation of a p-type organic semiconductor material which has a fluorinated alkyl group represented by Formula (1).

In FIG. 4, while the fluorinated alkyl group 21 of Compound P is oriented on the gas-liquid interface since the surface energy of the fluorinated alkyl group 21 is low, the branched chain of alkyl 22, which is not fluorinated, is assumed to be directed toward the inside of the coated layer. Also, since the line connecting the end of fluorinated alkyl group 21 and the end of the non-fluorinated alkyl group 22 is almost normal to the π conjugated plane of the mother moiety, as deduced from the molecular model, the π conjugated plane of the p-type organic semiconductor tends to be oriented parallel (Face-On orientation), as shown in FIG. 4. Accordingly, it is assumed that both of the formation of the preferred concentration gradient in the bulk heterojunction layer and the decrease in the series resistance can be achieved.

In order to obtain such a non-symmetric branched fluorinated alkyl group, a corresponding secondary alcohol may be easily obtained via the following Grignard reaction using an alkane-fluoride-iodide and an alkyl aldehyde. The alcohol can be converted to a desired substituent via a treatment using, for example, a tosyl chloride.

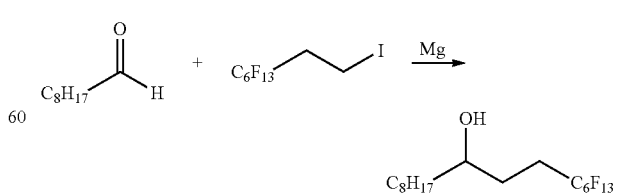

The following mother moieties may be exemplified as a p-type organic semiconductor mother moiety to which a fluorinated alkyl group can be bonded.

Examples of a condensed polycyclic aromatic group include: compounds such as oligothiophene, oligoparaphenylene, fluorine, carbazole, anthracene, tetracene, pentacene, hexacene, heptacene, chrysene, pysene, fuluminene, pyrene, peropyrene, perylene, terylene, quoterylene, coronene, ovalene, circumanthracene, bisanthene, sesulene, heptasesulene, pyranthrene, violanthene, isoviolanthene, circobiphenyl, thienothiophene, benzodithiophene, cyclopentadithiophene, dithienopyrrole, dithienosilole, ditienonaphthalene, benzo thiopheno benzothiophene, anthradithiophene, thienopyrazine, benzothiadiazole, diketo pyrrolo pyrrole and pyrazolotriazole; porphyrin and copper phthalocyanine; tetrathiafulvalene (TTF)-tetracyanoqui-nodimethan (TCNQ); bis-ethylene dithiatetrathiafulvalene (BEDTTTF); and derivatives thereof.

The p-type organic semiconductor material of the present invention can be obtained by replacing at least one of the hydrogen atoms of these mother moieties with an aforementioned fluorinated alkyl group. The organic semiconductor material may be a low molecular weight compound or a polymer, however, a polymer is preferred for the purpose of forming an appropriate domain structure with a fullerene compound which is an n-type organic semiconductor material.

In the present invention, a low molecular weight compound means a single molecule exhibiting no molecular weight distribution. On the other hand, a polymer compound means an aggregate of compounds obtained by reacting prescribed monomers and having a certain molecular weight dispersion. When defining actually in terms of the molecular weight, a compound having a molecular weight of preferably 5,000 or more is distinguished as a polymer compound, and the molecular weight is more preferably 10,000 or more and still more preferably 30,000 or more. On the other hand, the solubility of a polymer becomes deteriorated when the molecular weight of the polymer is increased. Accordingly, the molecular weight is preferably 1,000,000 or less and more preferably 100,000 or less. The molecular weight can be determined using a gel permeation chromatography (GPC). Also, purification of a polymer with respect to the molecular weight can be conducted by using a gel permeation chromatography (GPC) for fractionation.

The p-type organic semiconductor material containing an alkyl fluoride group is preferably used as a mixture with a p-type organic semiconductor material which is not substituted with a fluorinated alkyl group, since the fluorinated alkyl group causes lowering of solubility or variation of crystallinity due to its rigid nature, or, when the p-type organic semiconductor material is located eccentrically more than necessary, the phase separation area between the n-type organic semiconductor material is decreased, resulting in lowering of the short circuit current. In the present invention, it will be sufficient when the p-type organic semiconductor material is fluorinated to the extent that the contact between the hole transport layer and an n-type organic semiconductor material in the bulk heterojunction layer can be avoided, and sufficient performance can be obtained when the mass ratio of "p-type organic semiconductor material containing a fluorinated alkyl group": "p-type organic semiconductor material containing no fluorinated alkyl group" is from 1:99 to 30:70 in the bulk heterojunction layer. The ratio is more preferably from 3:97 to 20:80, and further more preferably from 5:95 to 15:85.

Alternatively, the compound containing a linear or branched fluorinated alkyl group having 6 or more but 20 or less carbon atoms maybe a copolymer of a monomer containing a fluorinated alkyl group and a monomer containing no fluorinated alkyl group (a monomer having no substituent or a monomer having a usual alkyl group). It is preferable that the aforementioned monomer containing a fluorinated alkyl group and monomer containing no fluorinated alkyl group have a common mother moiety. In such a case, the preferable copolymerization ratio is "monomer containing a fluorinated alkyl group": "monomer containing no fluorinated alkyl group" is from 1:99 to 30:70, and it is more preferably from 5:95 to 20:80.

As a more preferred p-type organic semiconductor mother moiety, a donor•acceptor type π conjugated polymer obtained by copolymerizing a donor unit and an acceptor unit may be cited. For such a polymer, generation of a high current density can be expected since the absorbing wavelength extends to a longer wavelength region, whereby a wider range of sun light can be absorbed.

Examples of such a polymer include: a polythiophene-thienothiophene copolymer disclosed in Nature Mat., (2006), vol. 5, p 328; a polythiophene-diketo pyrrolo pyrrole copolymer disclosed in WO 08/664; a polythiophene-thiazolothiazole copolymer disclosed in Adv Mater., 2007, p 4160; a poly(cyclopentadithiophene-benzothiadiazole) copolymer (PCPDTBT) etc. disclosed in Nature Mat., vol. 6 (2007), p 497; a poly(silanecyclopentadithiophene-benzothiadiazole copolymer disclosed in US 2008087324; a poly (benzothiophene-thienothiophene copolymer disclosed in Adv. Mater. 2010, p 22; and a polycarbazole derivative disclosed in Adv. Mater, 2007, 19, p 2295. By using these polymers while replacing the alkyl chain or a hydrogen atom with the fluorinated alkyl group of the present invention, the effect of the present invention can be easily obtained.

As a more preferable p-type organic semiconductor material, a donor•acceptor type polymer in which the acceptor unit has a structure represented by Formula (2) may be cited.

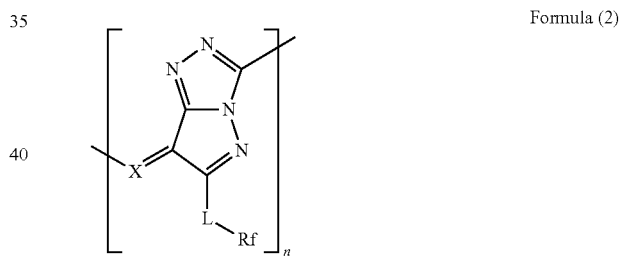

Formula (2)

wherein Rf represents an alkyl fluoride group represented by Formula (1), X represents an atom selected from CH and N, L represents a single bond or a divalent connecting group selected from an alkenylene group (when it has a saturated bond, the saturated bond is on the side of the bond between the mother moiety), an ethynylene group (when it has a saturated bond, the saturated bond is on the side of the bond between the mother moiety), an arylene group, an ether group, a thioether group, an imino group, a carbonyl group, an ester group, an amide group, a sulfoxide group, a sulfonyl group and a phosphoryl group.

The unit represented by Formula (2) (a pyrazolotriazole unit) has a structure used for color production of magenta or cyan in the silver-salt photography, and it has been know as a dye exhibiting high durability. Namely, it has a deep HOMO level, and has a merit that stability against oxygen and a high open circuit voltage can be expected. Also, it has an effect that the absorbance is high and the light absorption efficiency can be enhanced.

Among these units, L in Formula (2) is preferably one of a carbonyl group, an ester group, and an amide group. Of these, it is preferable that L is an ester group.

Specific examples of a compound containing a linear or branched fluorinated alkyl group having 6 or more but 20 or less carbon atoms will be shown below, however, the present invention is not limited thereto.
1
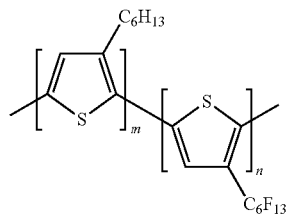
2
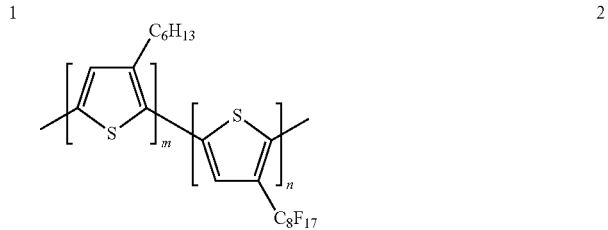
3
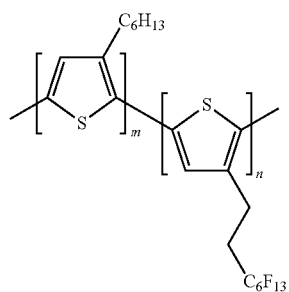
4
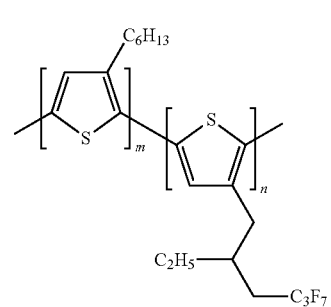
5
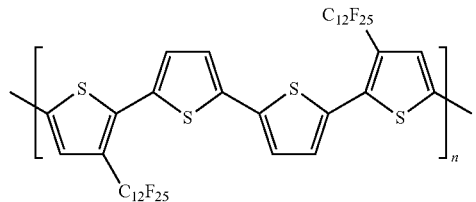
6
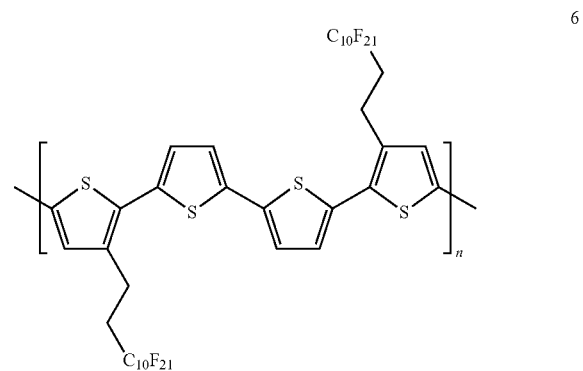
7
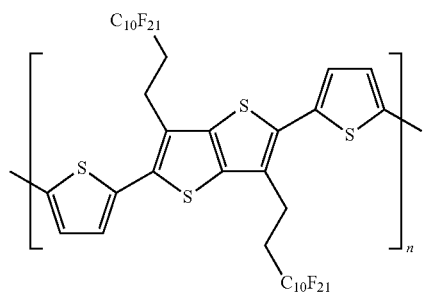
8
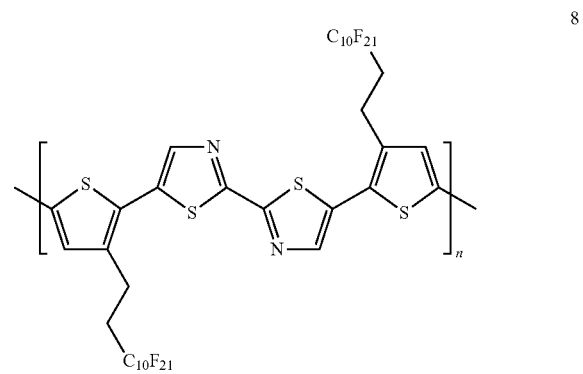

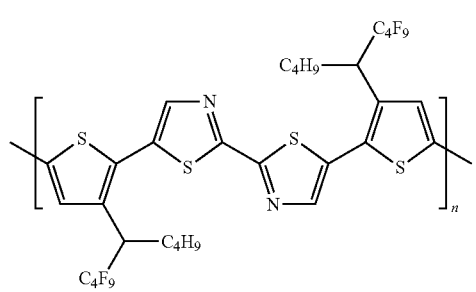
9
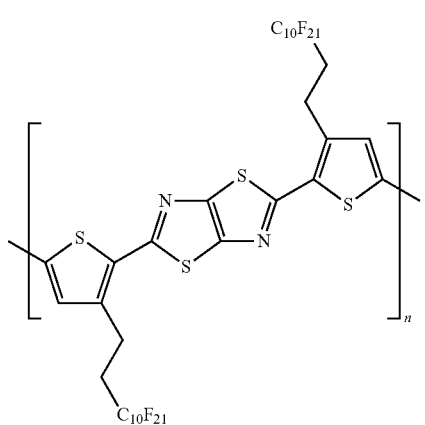
10
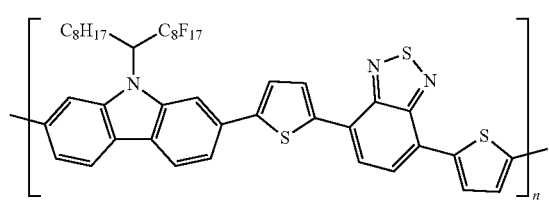
11
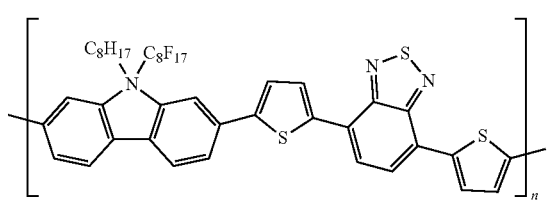
12
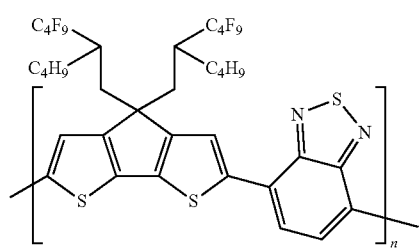
13
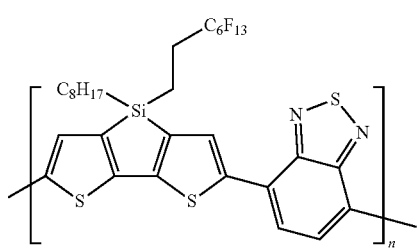
14
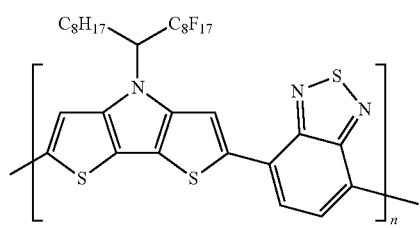
15
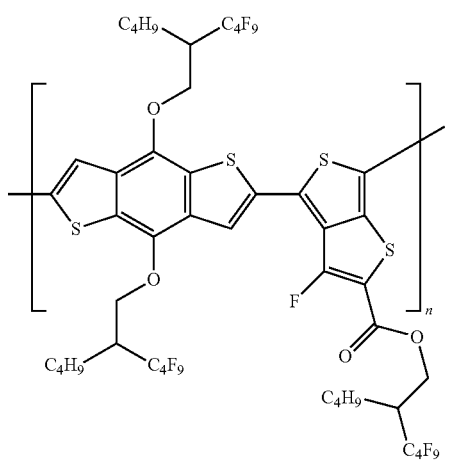
16

-continued
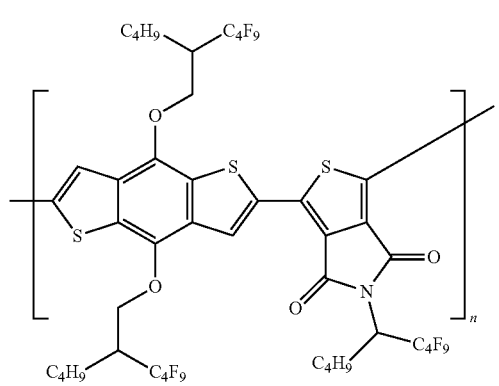
17
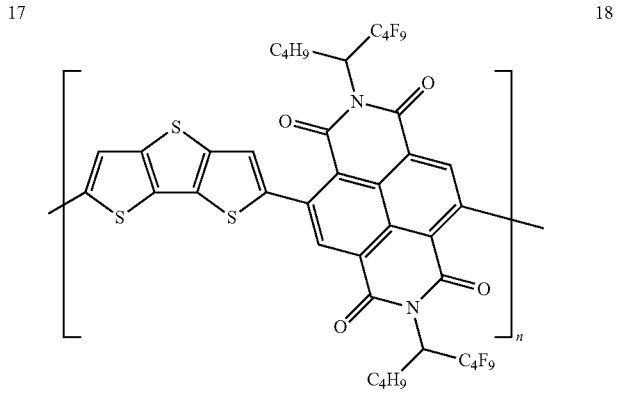
18
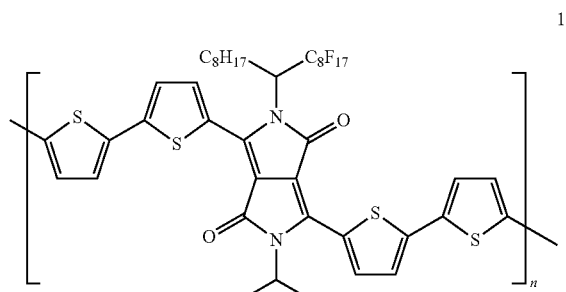
19
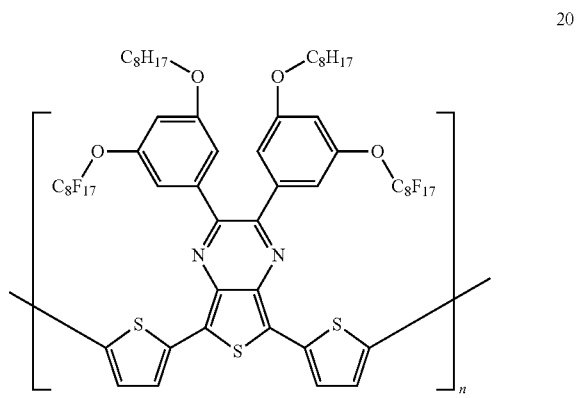
20
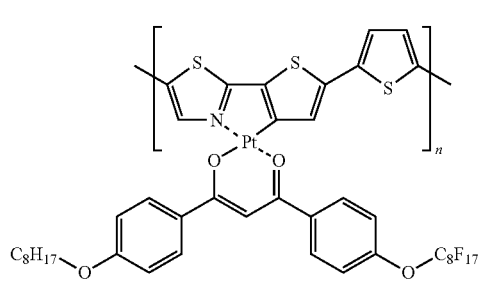
21
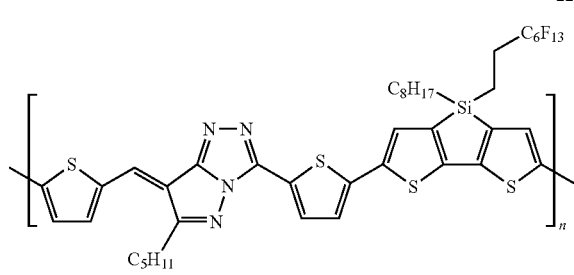
22
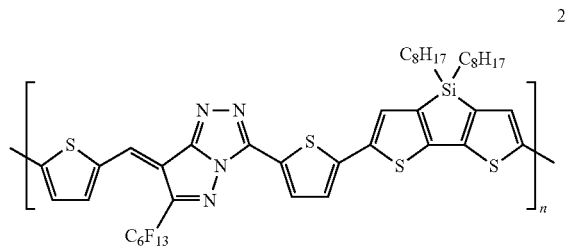
23
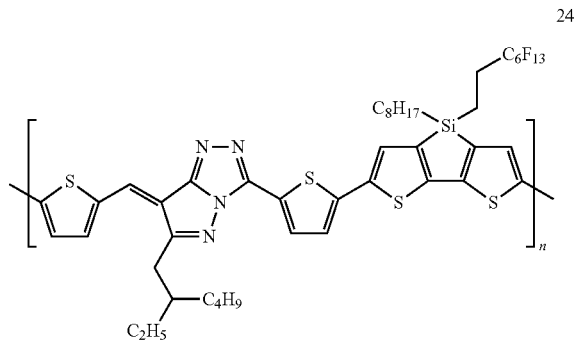
24

-continued
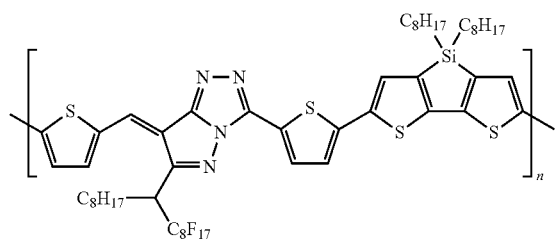
25
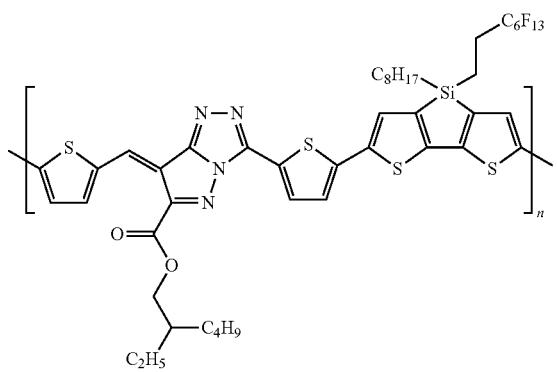
26
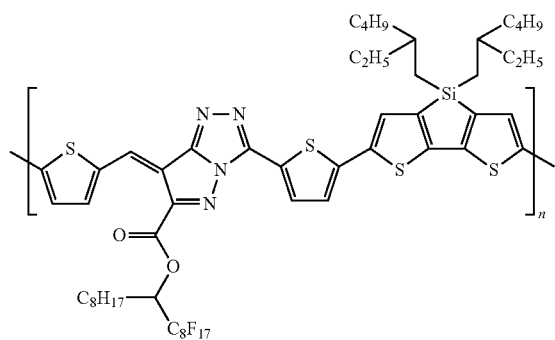
27
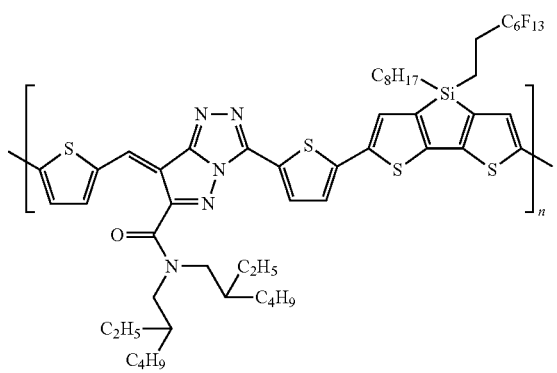
28
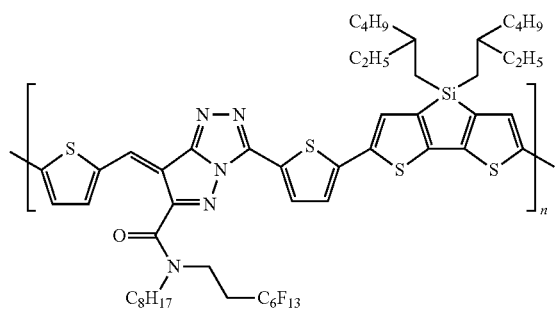
29
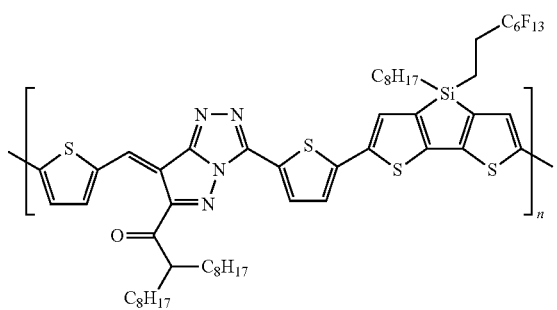
30
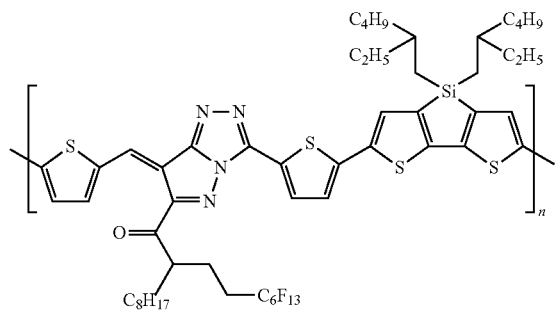
31
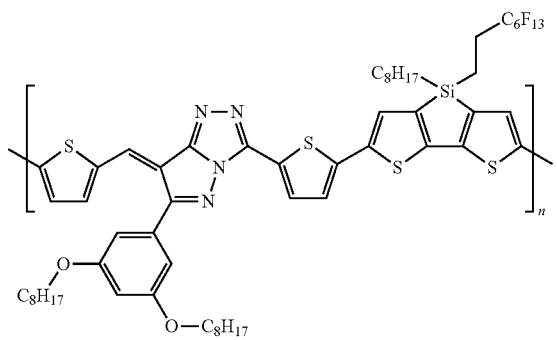
32

-continued
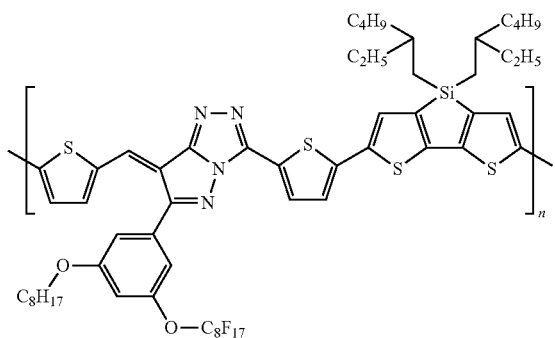
33
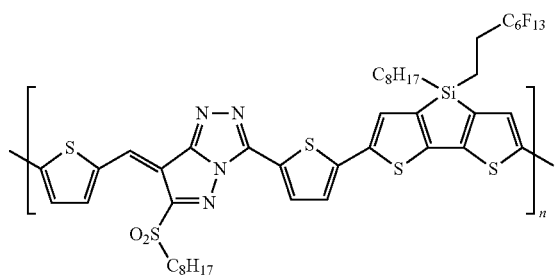
34
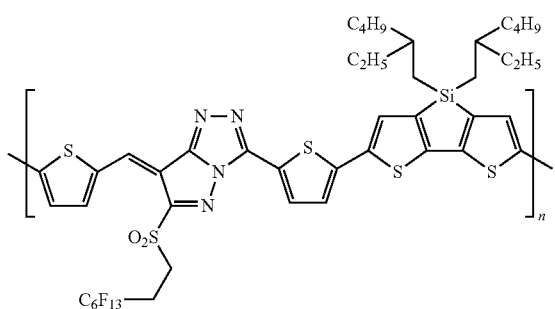
35
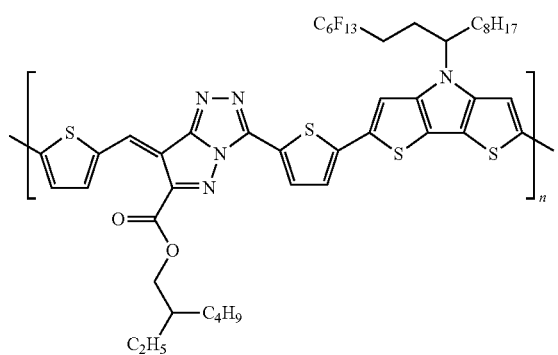
36
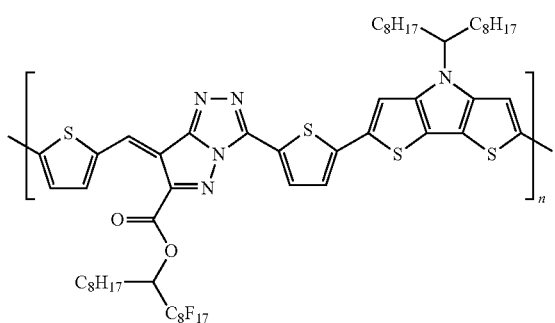
37
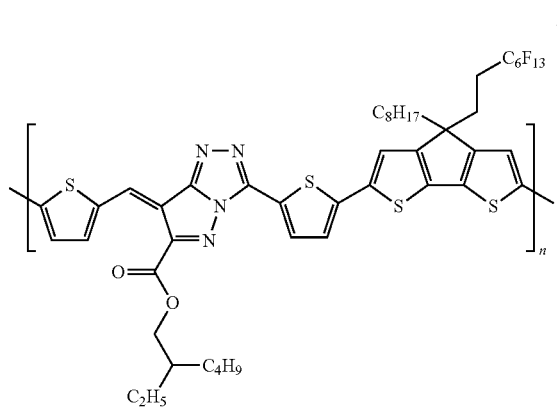
38
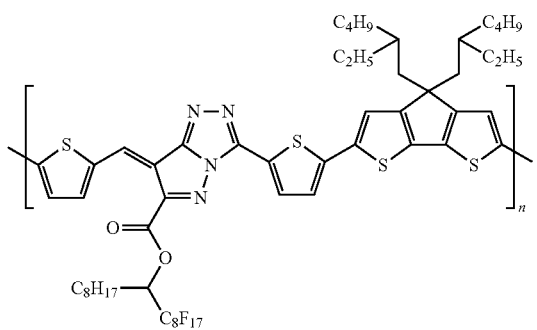
39
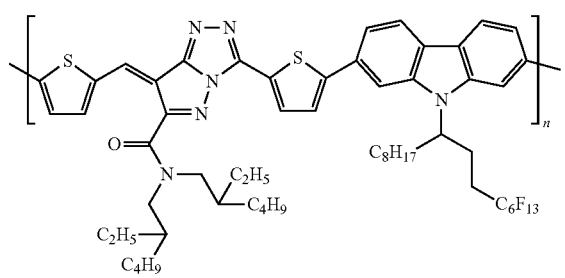
40

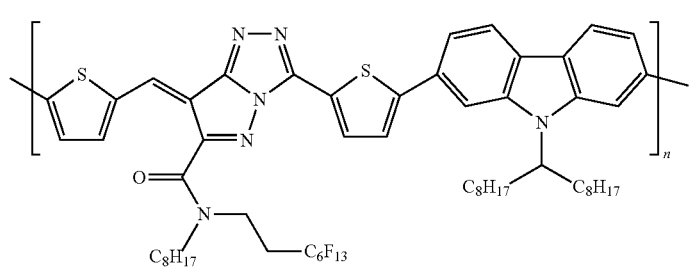
41
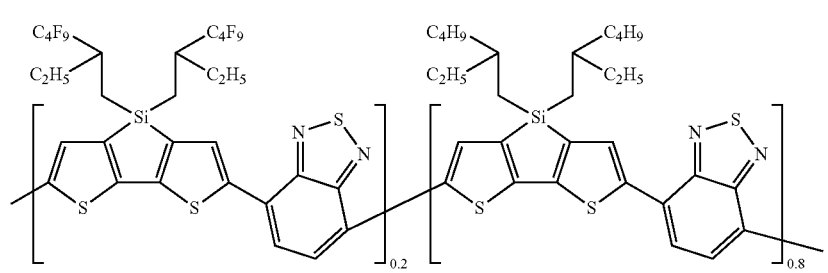
42
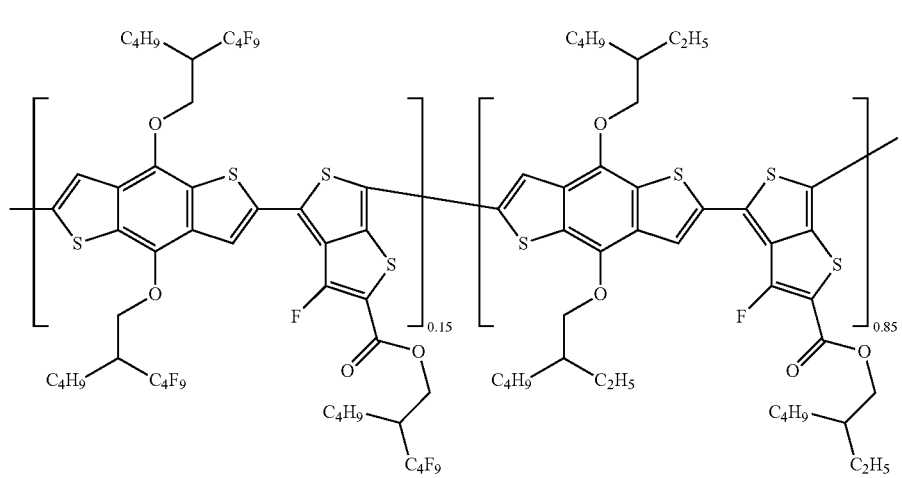
43
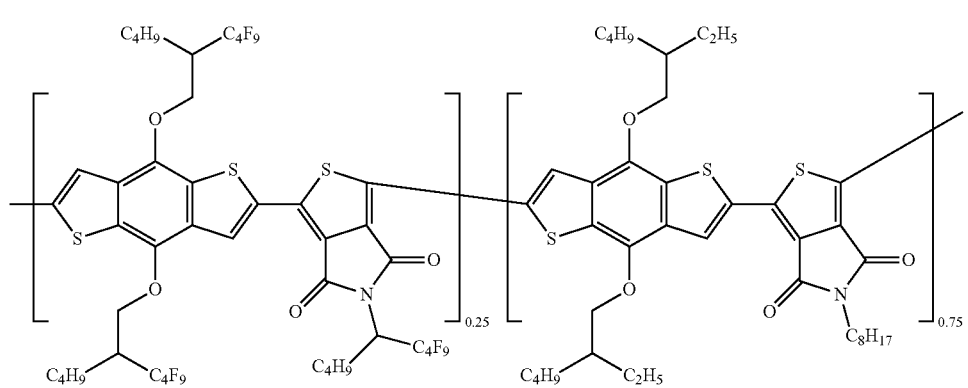
44

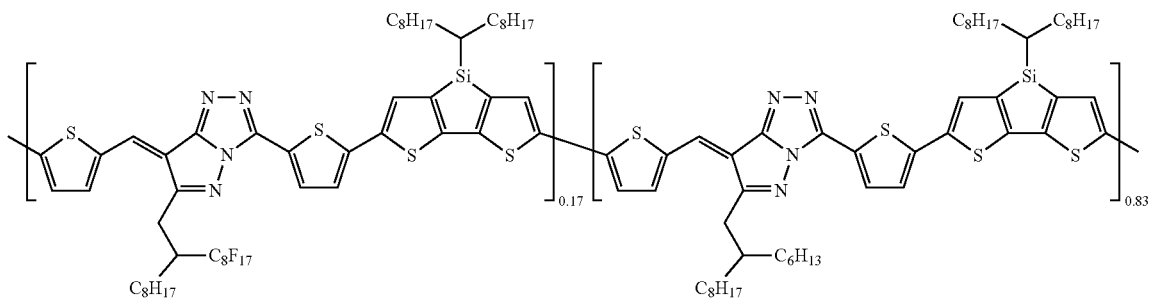

45

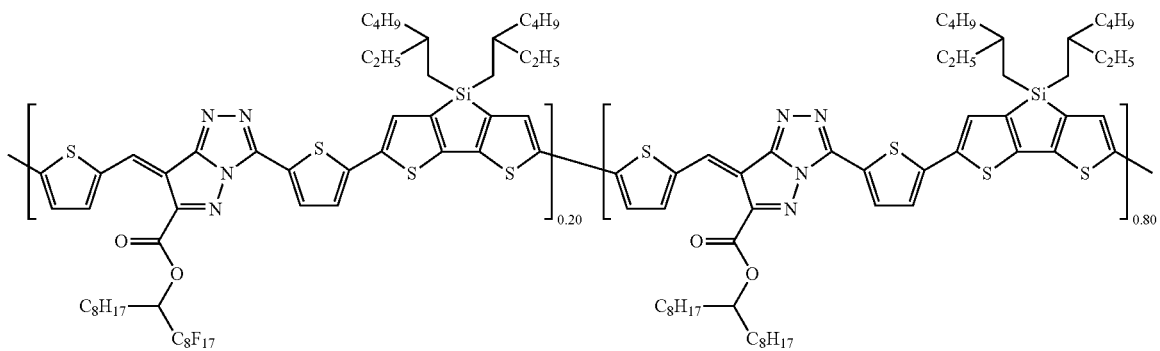

46

With respect to the synthesis of the compound having such a structure, the monomer unit can be synthesized with referring JP-A No. 2004-217884, Japanese Patent Application No. 2005-142378, Japanese Patent No. 3907142, JP-A Nos. 2001-083670, 2003-005330, 2003-089698, and the compound can be synthesized with referring to Adv. Mater. 2007, vol. 19, p 2295, Nature Mat., (2006), vol. 5, p 328, WO 081664, Adv Mater., 2007, p 4160, US 2008087324, Adv. Mater. 2010, p 22 and Adv. Mater. 2007, 19, p 2295.

Examples of a compound which is preferably used as p-type organic semiconductor material, other than the compound of the present invention, include: σ conjugated polymers such as polypyrrole and its oligomer, polyaniline, polyphenylene and its oligomer, polyphenylene vinylene and its oligomer, polythienylene vinylene and its oligomer, polyacetylene, polydiacetylene, polysilane and polygermane; polythiophene such as poly 3-hexyl thiophene (P3HT) and its oligomer; polythiophene having a polymerizable group disclosed in Technical Digest of the International PVSEC-17, Fukuoka, Japan, 2007, p 1225; a polythiophene-thienothiophene copolymer disclosed in Nature Material, (2006) vol. 5, p 328; a polythiophene-diketo pyrrolo pyrrole copolymer disclosed in WO2008000664; a polythiophene-thiazolothiazole copolymer disclosed in Adv. Mater, 2007, p 4160; PFDTBT disclosed in APPLIED PHYSICS LETTERS vol. 92, and p 033307 (2008); a conjugated polymer such as PTB1-6 disclosed in AM. CHEM. SOC., vol. 131, p 7792 (2009); a pentacene derivative having a substituent disclosed in, for example, WO 03/16599, WO 03/28125, U.S. Pat. No. 6,690,029 and JP-A No. 2004-107216; a pentacene precursor disclosed in, for example, US 2003/136964; and a condensed polycyclic compound substituted with a trialkylsilylethinyl group disclosed in, for example, J. Amer. Chem. Soc., vol 127. No. 14. 4986, J. Amer. Chem. Soc., vol. 123, p 9482, J. Amer. Chem. Soc., vol. 130 (2008), No. 9, p 2706.

Of these, in the present invention, cited are a polythiophene-carbazole-benzothiazole copolymer which is a low band gap polymer exhibiting absorption in the range of from 650 nm to a longer wavelength disclosed in Adv. Mater. vol. 19 (2007) p 2295, PCPDTBT disclosed in Nature Mat. vol. 6 (2007), p 497, and Si-PCPDTBT disclosed in US 20080087324.

[n-Type Organic Semiconductor Material]

The n-type organic semiconductor material used in the photoelectric conversion layer of the present invention is not specifically limited, and examples of an n-type organic semiconductor material include: fullerene, octaazaporphyrin, a perfluoro compound obtained by replacing the hydrogen atoms of the mother moiety of a p-type organic semiconductor material with fluorine atoms (for example, perfluoropentacene and perfluorophthalocyanine), and a polymer compound which contains an aromatic carboxylic acid anhydride and its imide in the structure, such as naphthalenetetracarboxylic anhydride, naphthalenetetracarboxylic diimide, perylenetetracarboxylic anhydride, and perylenetetracarboxylic diimide.

Among them, a fullerene derivative which enables rapid (around 50 femto seconds) and effective charge separation with a various p-type organic semiconductor material is preferably used. Examples of a fullerene derivative include: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, nano-hors (cone type), and a fullerene derivative in which a part thereof is replaced with a hydrogen atom, a halogen atom, a substituted or non-substituted alkyl group, an alkenyl group, an alkynyl group, an aryl group, a heteroaryl group, a cycloalkyl group, a silyl group, an ether group, a thioehter group, an amino group or a silyl group. The aforementioned fullerene derivative is used only as an n-type organic semiconductor material, but not used as a p-type organic semiconductor material.

Of these, preferable is a fullerene derivative of which solubility was improved by having a subsituent, for example, N-Methylfulleropyrrolidine, [6,6]-phenyl C61-butyric acid methyl ester (abbreviated name PCBM) which is represented by the following constitutional formula, [6,6]-phenyl C61-butyric acid n-butyl ester (PCBnB), [6,6]-phenyl C61 butyric acid isobutyl ester (PCBiB), [6,6]-phenyl C61 butyric acid n-hexyl ester (PCBH), bis-PCBM disclosed, for example, in Adv. Mater., vol. (2008), p 2116, an amination fullerene discolored in JP-A No. 2006-199674, a metallocen-containing fullerene disclosed in JP-A No. 2008-130889, a fullerene containing a cyclic ether group disclosed in U.S. Pat. No. 7,329,709, SIMEF disclosed in Amer. Chem. Soc., (2009) vol. 130, and p 15429, and C60MC12 disclosed in Appl. Phys. Lett., Vol. 87 (2005), p 203504.

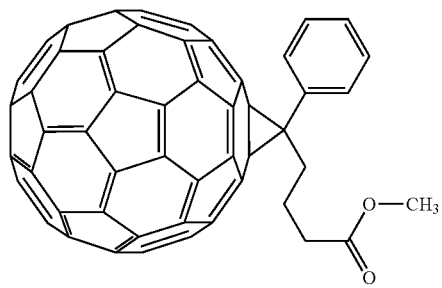

PCBM

[Method of Forming Photoelectric Conversion Layer]

A method of forming Photoelectric conversion layer 14 in which an electron donoor (p-type organic semiconductor material) and an electron acceptor (n-type organic semiconductor material) are mixed will be explained below.

The mixing ratio of an electron donor:an electron acceptor may be arbitrarily selected in the range from 10:90 to 90:10. In practice, by evaluating the fluorescence emission efficiency when a photoelectric conversion layer is irradiated with excitation light of the p-type organic semiconductor material, the efficiency of the photoelectric conversion process, of from light absorption to charge separation. Namely, the mixing ratio which gives the smallest fluorescence emission efficiency may be estimated as the mixing ratio at which efficient charge separation can be conducted. The appropriate mixing ratio is varied depending on the practically used material, however, the mixing ratio is often in the range from 20:80 to 60:40. Since light absorption is mainly carried out by an electron donor (a p-type organic semiconductor material), it is preferred that the mixing ratio of an electron donor is higher. Accordingly, the mixing ratio is preferably in the range from 33:67 to 60:40.

Examples of a method of forming a photoelectric conversion layer in which a p-type organic semiconductor material and an n-type organic semiconductor material are mixed include: a vacuum evaporation method, and a coating method (including a casting method and a spin coating method). Of these, a coating method is preferred to increase the area of the aforementioned interface at which charge separation of the positive holes and electrons occurs, and to prepare an element having a high photoelectric conversion efficiency. Also, the coating method provides an excellent production rate.

The method of coating used in the coating method is not specifically limited, however, cited are, for example, a spin coating method, a casting method from a solution, a die coating method, a dip coating method, a wire bar coating method, a gravure coating method and a spray coating method. Further, patterning can be conducted by the printing methods, for example, an inkjet method, a screen printing, a letterpress method, an intaglio printing method, an offset printing method, and a flexographic printing method.

The thickness of the photoelectric conversion layer formed via such a film forming method is preferably 50 to 300 nm. Accordingly, preferred is a method which enables formation of a film having such thickness in one-pass with an excellent productivity. As a method which meets such a condition, preferred are, for example, a wire bar coating method and a die coating method. The concentration of a photoelectric conversion layer coating solution used in such a film forming method is preferably a concentration of 0.5 to 5.0% by mass, more preferably 1.0 to 3.0% by mass, and further more preferably 1.5 to 2.5% by mass, as the sum of an electron donor and an electron acceptor.

The solvent is not specifically limited as far as the solvent can dissolve an electron acceptor an electron acceptor in the aforementioned concentration, and examples of such a solvent include: a halogen-containing solvent such as dichloromethane, chloroform, dichloroethane, tetrachloroethane, chlorobenzene, dichlorobenzene, trichlorobenzene and chloronaphthalene; an aromatic solvent such as benzene, toluene, xylene, mesitylene, anisole, and benzonitile; tetrahydrofuran; and carbon disulfide.

When a coating liquid of a photoelectric conversion layer is applied, the aforementioned compound which has a linear or branched fluorinated alkyl group having 6 or more carbon atoms (the p-type organic semiconductor material) becomes oriented neat the interface between the air, and this state is fixed by drying. By providing a material for the counter electrode via a method, for example, vacuum evaporation on the photoelectric conversion layer, after drying, an organic photoelectric conversion element having a concentration gradient suitable for the reverse layer structure can be prepared.

It is preferable to provide a hole transport layer between the photoelectric conversion layer and the counter electrode, instead of directly forming a counter electrode on the photoelectric conversion layer, because the backward flow of electrons can be prevented.

After coating, annealing is preferably conducted in order to remove remaining solvent, moisture and gas, and to cause enhancement of the mobility of electrons and elongation of absorbing wavelength, due to the crystallization of the semiconductor material. If annealing treatment is carried out at a predetermined temperature in the manufacturing process, microscopic aggregation of a part occurs, or crystallization is promoted, whereby a suitable phase separation structure can be formed in the photoelectric conversion layer. As the result, the mobilities of positive holes and electrons (namely, carriers) are enhanced and a high efficiency can be obtained.

The photoelectric conversion layer may be a single layer in which an electron donor and an electron acceptor are mixed, however, it may have a multi-layer structure, in which the mixing ration of the electron donor and the electron acceptor is varied.

[Electron Transport Layer (Hole Blocking Layer)]

The organic photoelectric conversion element of the present invention is preferably provided with an electron transport layer between the photoelectric conversion layer and the cathode. This enables to more efficiently take out the electric charge generated in the bulk heterojunction layer.

The electron transport layer means a layer which is located between the cathode and the bulk heterojunction layer and enables the donation and acceptance of electrons more efficiently. More specifically, preferably used in the electron transport layer is a compound having a LUMO level which is in between the LUMO level of the n-type organic semiconductor material contained in the bulk heterojunnction layer and the work function of the cathode. More preferable is a compound having a mobility of an electron is $10^{-4}$ or more.

To an electron transport layer having a HOMO level deeper than the HOMO level of the p-type organic semiconductor material used in the bulk heterojunction layer, provided is a hole blocking function having a rectifying effect by which the flow of the positive hole generated in the bulk heterojunction layer to the cathode side is prevented. Such an electron transport layer is also referred to as a hole blocking layer. It is more preferable that a material having a HOMO level deeper than the HOMO level of the n-type organic semiconductor is employed. Also, it is preferable to use a compound having a hole mobility of $10^{-6}$ or lower, in view of blocking positive hole.

As an electron transport layer, there can be used: octaazaporphyrin and perfluoro derivative of a p-type organic semiconductor (for example, perfluoro pentacene and perfluoro phthalocyanine) or a carboline compound disclosed in WO 04/095889. To the electron transport layer which has a HOMO level deeper than the HOMO level of the p-type semiconductor material used for a bulk heterojunction layer, there is provided, a hole blocking function having an rectifying effect by which the hole generated in the bulk heterojunction layer is not passed to the cathode side. More preferably, a material having a HOMO level deeper than the HOMO level of the n-type organic semiconductor material is used. Also, it is preferable to use a compound having a high electron mobility in view of the electron transport property.

The above described electron transport layer is also called a hole blocking layer, and it is more preferable to use the electron transport layer which have such function. Examples of such a material include: a phenanthrene system compound such as bathocuproine; an n-type semiconductor material such as naphthalenetetracarboxylic acid anhydride, naphthalenetetracarboxylic acid diimide, perylenetetracarboxylic acid anhydride and perylenetetracarboxylic acid diimide; an n-type inorganic oxide such as titanium oxide, zinc oxide and gallium oxide; and an alkali metal compound such as lithium fluoride, sodium fluoride and cesium fluoride. Moreover, a layer which is made of a single substance of an n-type semiconductor material used for the bulk heterojunction layer can also be used.

As a means to form these layers, although any one of a vacuum evaporation method and a solution coating method can be used, it is preferably used a solution coating method.

[Hole Transport Layer (Electron Blocking Layer)]

The organic photoelectric conversion element of the present invention is preferably provided with a hole transport layer formed between the photoelectric conversion layer and the anode. This enable to take out more efficiently the electric charge generated in the photoelectric conversion layer.

As a material to constitute the aforesaid layers, there can be used for a hole transport layer, for example: PEDOT (poly-3,4-ethylenedioxythiophene)-PSS (polystylene sulfonic acid) (product name Baytron™ made by Starck Vitec Co.), polyaniline and its dope material, and a cyan compound described in WO 2006019270. In addition, to the electron transport layer which has a LUMO level shallower than the LUMO level of the n-type semiconductor material used for photoelectric conversion layer, there is provided an electron block function having an rectifying effect by which the electron generated in the photoelectric conversion layer is not passed to the anode side. The above-described hole transport layer is also called an electron blocking layer, and it is more preferable to use a hole transport layer having such function.

Examples of these materials include: a triaryl amine compound described in JP-A No. 5-271166, a metal oxide such as molybdenum oxide, nickel oxide and tungsten oxide. Moreover, the layer which consists of a single substance of a p-type semiconductor material used for the photoelectric conversion layer can also be used. As a means to form these layers, although any one of a vacuum evaporation method and a solution coating method can be used, it is preferable to use a solution coating method. When an under layer is formed with a coating method before forming a photoelectric conversion layer, it will have an effect of leveling the coating surface. This will result in decreasing a leaking effect and it is preferable.

In the same way, the hole mobility of the hole transport layer is preferably not less than $10^{-4}$ in view of the hole transport property, and the electron mobility of the hole transport layer is preferably not more than $10^{-6}$ in view of the electron blocking property.

[Other Layers]

It is also adequate to make a composition containing various inter layers in an element for the purpose of improvement in energy conversion efficiency, and improvement in lifetime of an element. Examples of an interlayer include: a positive hole blocking layer, an electron blocking layer, a positive hole injection layer, an electron injection layer, an exciton blocking layer, a UV absorption layer, a light reflection layer and a wavelength conversion layer.

[Electrodes]

The organic photoelectric conversion element of the present invention has at least a first electrode and a second electrode. When a tandem construction is employed, the tandem construction can be achieved by using an intermediate electrode. Here, in the present invention, the electrode to which positive holes mainly flows is the second electrode and the electrode to which electrons mainly flow is the first electrode. Accordingly, the first electrode is the cathode and the second electrode in the anode.

There may be a case in which the electrode having a light transmitting nature is referred to as a transparent electrode and the electrode having no light transmitting nature is referred to as a counter electrode, in view of the presence or non-presence of a light transmitting nature. In the present invention, the transparent electrode having a light transmitting nature is preferably used as the cathode and the counter electrode having no light transmitting nature is preferably used as the anode, since the reverse layer structure is employed.

[First Electrode (Cathode)]

The first electrode (cathode, an electrode from which electrons are taken out) of the present invention is preferably a transparent electrode, and further preferably an electrode which transmits light of the wavelength of from 380 to 800 nm. Examples of a material include: a transparent metal oxide such as indium tin oxide (ITO), AZO, FTO, $SnO_2$, ZnO, titanium oxide; an extremly thin metal layer or a metal nanowire of such as Ag, Al, Au and Pt; a layer containing a nanowire or nano particles of such as carbon nanotube; a conductive polymer material such as PEDOT:PSS and polyanirine.

Also applicable is, for example, a conductive polymer selected from the group of derivatives of polypyrrole, polyaniline, polythiophene, poly thienylene vinylene, polyazulene, polyisothia naphthene, polycarbazole, polyacetylene, polyphenylene, polyphenylene vinylene, polyacene, polyphenyl acetylene, polydiacetylene, and polynaphthalene. Further, a plurality of these conductive compounds may be combined to form a cathode.

Whether the first electrode which is a transparent electrode works as relatively a cathode or an anode depends on the relationship regarding the work function between the later mentioned second electrode or a hole transport layer. However, since the work function of the generally stable metal electrode used as the second electrode is 4.7 eV or more, the first electrode (namely, the cathode) is preferably a transparent electrode having a work function of 4.7 eV or less.

As an example of such a transparent electrode, the aforementioned ITO may be cited. Although, the work function of ITO depends on the surface condition, the method of washing, or the measuring method, it has been disclosed that the work function of ITO is 4.4 eV when measured by photoelectron spectroscopy which is one of the methods having a high accuracy as a method to measure the work function (for example, Appl. Phys. Lett., Vol. 74, No. 6, p 880). In the case of a reverse layer structure, the built-in potential (namely, the difference in the work function between the first electrode and the second electrode) becomes more easy to be enlarged, as the work function of the cathode is decreased, by which the current becomes easier to be taken out. Accordingly, the cathode of the present invention is preferably an ITO. Further, preferable is an ITO which has been treated with a basic compound as described in the aforementioned paper so that the work function becomes shallow.

[Second Electrode (Anode)]

The second electrode may be singly composed of a conductive material, however, a resin may also be used in combination in addition the material having electrical conductivity.

The built-in potential, namely, the difference in the work function between the first electrode and the second electrode, is preferably as large as possible, in order that the carriers generated in the bulk heterojunction layer diffuse to reach the respective electrodes.

Accordingly, a metal, an alloy or an electrically conductive compound, or a mixture thereof, each having a larger work function (namely, 4.5 eV or more) is preferably used as an electrode material of the second electrode. Examples of such an electrode material include: gold, silver, copper, platinum, rhodium, indium, nickel and palladium.

For example, according to Handbook of Chemistry and Physics., the work function of gold is 5.1 eV, the work function of silver is 4.73 eV, the work function of copper is 4.7 eV, the work function of platinum is 6.35 eV, and the work function of nickel 5.01 eV. Aluminum which is often employed in a forward layer structure has a work function of 4.08 eV, magnesium has a work function of 3.68 eV and calcium has a work function of 2.9 eV. The work function of PEDOT:PSS which is an organic conductor is generally mentioned to be from 5.1 to 5.3 eV. Also it is possible to use PEDOT:PSS having thereon a metal grid as an anode in a reverse layer structure, such as disclosed in Organic Electronics (2009) p 1424.

Of these, silver is most preferable as the second electrode in view of the extraction performance of positive holes, the reflectance of light, and resistance for oxidation.

The second electrode can be prepared by forming a thin film via preferably vacuum evaporating or sputtering these electrode materials. The thickness is generally selected from the range of 10 nm to 5 μm, and preferably selected from the range of 50 to 200 nm.

In the case when the anode side is light transmissive, for example, a light transmissive cathode can be obtained by providing a film of a conductive-light transmissive material described in the above explanation of transparent electrodes, after forming a thin film having a thickness is 1 to 20 nm using a conductive material suitable for the cathode, for example, aluminum and an aluminum alloy, and silver and a silver alloy.

[Intermediate Electrode]

As a material for an intermediate electrode which is needed in a tandem construction as shown in FIG. 3, preferably, it is a layer using the compound having both transparency and electro conductivity. Examples of a material for an intermediate electrode include the materials cited as preferable materials for the first electrode (namely, a transparent metal oxide such as ITO, AZO, FTO, $SiO_2$ and ZnO, or titanium oxide; a very thin metal layer of such as Ag, aluminum and Au; a layer containing nanoparticles or nanowires such as a metal nanowire or a carbon nanotube; and a conductive polymer material such as PEDOT:PSS and poly aniline).

In addition, among combinations of the aforesaid hole transporting layer and electron transportation layer, there may be a combination which acts as an intermediate electrode (electric charge recombination layer) when they are suitably selected and laminated with each other. When such composition is realized, it is preferable since one manufacturing process for forming one layer can be omitted.

[Substrate]

When the light to be subjected to photoelectric conversion enters from the substrate side, it is preferable that the substrate is made of a member enabling to transmit the light by which photoelectric conversion is carried out. That is, it is preferable that the substrate is made of a transparent member to the wave length of light by which photoelectric conversion is conducted. As for a substrate, although a glass substrate and a resin substrate are cited suitably, it is preferable to use a transparent resin film from the viewpoints of lightness and flexibility. In the present invention, there is no restriction in particular to the transparent resin film which can be preferably used as a transparent substrate, and it can be suitably chosen from the known materials in terms of the form, structure and thickness.

Specific examples of a resin film include: a polyester resin film such as polyethylene terephthalate (PET), polyethylene naphtalate (PEN) and modified polyester; a polyolefin resin film such as a polyethylene (PE) resin film, a polypropylene (PP) resin film, a polystyrene resin film and a cyclic olefin resin; a vinyl resin film such as polyvinylchloride and polyvinylidene chloride; a polyether ether ketone (PEEK) resin film; a polysulfone (PSF) resin film; a polyethersulfone (PES) resin film; a polycarbonate (PC) resin film; a polyamide resin film; a polyimide resin film; an acrylic resin film; and a triacetyl cellulose (TAC) resin film. If the resin film exhibits transmittance for the light of a visible range (380 to 800 nm) is 80% or more, it is preferably applicable to the transparent resin film concerning the present invention.

Especially, from the viewpoints of transparency, heat resistance, ease of handling, strength and cost, the following resins are preferable: a biaxial stretching polyethylene terephthalate film, a biaxial stretching polyethylene naphthalate film, a polyethersulfone film and a polycarbonate film. Among them, a biaxial stretching polyethylene terephthalate film and a biaxial stretching polyethylene naphthalate film are more preferable.

In order to secure the wettability and the adhesion property of a coating solution, surface treatment can be performed and an adhesion assisting layer can be prepared to the transparent substrate used for the present invention. About surface treatment or an adhesion assisting layer, a well-known technique can be used conventionally. For example, as surface treatment, there can be cites a surface activation process such as: a corona discharge treatment, a flame treatment, an ultraviolet treatment, a high-frequency treatment, a glow discharge process, an activity plasma treatment and a laser process. Moreover, as an adhesion assisting layer, there can be cited, for example, polyester, polyamide, polyurethane, vinyl system copolymer, butadiene system copolymer, acrylic system copolymer, vinylidene system copolymer and epoxy system copolymer.

In order to control transmission of oxygen and water vapor, a barrier coat layer may be formed beforehand to the transparent substrate, or a hard coat layer may be formed beforehand on the surface opposite to the surface on which a transparent conductive layer is transferred.

[Optical Function Layer]

The organic photoelectric conversion element of the present invention may be provided with a various type of optical function layers for the purpose of efficient light receiving of sunlight. As an optical function layer, there may be provided with an anti-reflection layer, a light condensing layer such as a microlens array, a light diffusion layer which can scatter the light reflected by the cathode and can make the light enter again in the bulk heterojunction layer.

As an anti-reflection layer, well-known anti-reflection layer can be prepared. For example, when a transparent resin film is a biaxial stretching polyethylene terephthalate film, it is preferable to set the refractive index of the adhesion assisting layer, which is adjacent to the film, to be 1.57 to 1.63. This will improve transmittance with decreasing the interface reflection between the film substrate and the adhesion assisting layer. As a way of adjusting a refractive index, it can be carried out by adjusting suitably the ratio of a binder resin to oxide sol having a comparatively high refractive index such as a tin oxide sol and a cerium oxide sol and by coating it. Although a single layer of adhesion assisting layer may be sufficient, in order to raise adhesion property, a composition of two or more adhesion assisting layers may be used.

Examples of a light condensing layer are as follows: to set a structure of a micro lens array on the sunlight receiving side of the substrate; and to combine a so-called light condensing sheet to increase an amount of the receiving light from a specific direction, or conversely, to decrease incident angle dependability of sunlight.

As an example of a microlens array, it can be cited an arrangement in which the quadrangular pyramidal forms having a base of 30 μm and a vertex angle of 90 degrees are arranged in two dimensions on the light taking out side of a substrate. As for a base, the range of 10 to 100 μm is desirable. When it is smaller than this range, the effect of diffraction will occur to result in coloring, while when it is larger than this range, the thickness becomes large. They are not desirable.

Moreover, as a light scattering layer, a various types of anti-glare layers and a layer in which are distributed nanoparticles or nanowire made of metal or various inorganic oxides in a colorless transparent polymer can be cited.

[Patterning]

There is no restriction in particular to the way and the process of patterning, for example, an electrode, a power generation layer, a hole transport layer and an electron transport layer of the present invention, and a known approach can be applied suitably.

In the case of a soluble material used for a bulk heterojunction layer and a transport layer, only a unnecessary part may be wiped off after the application on the surface with a die coat, or a dip coat, or direct patterning may be conducted at the time of an application using a methods such as an inkjet method or a screen printing method.

In the case of an insoluble material, for example, an electrode material, patterning may be conducted via vacuum evaporation using a mask when an electrode is accumulated using vacuum evaporation, or may be conducted using a well-known method such as etching or lift-off. Moreover, pattering may be conducted by transferring a pattern formed on another substrate.

[Sealing]

In order to prevent deterioration of the produced organic photoelectric conversion element due to oxygen or water existing in the environment, it is preferable to carry out sealing with a method known, only in the field of an organic photoelectric conversion element, but also in the field of, for example, an electroluminescent element.

For example, the following methods can be cited: a method of carrying out sealing by pasting up a cap made of aluminum or glass with an adhesive agent; a method of adhering a plastic film on which a gas barrier layer made of aluminum, silicon oxide, or aluminum oxide has been formed with an organic photoelectric conversion element using an adhesive agent; a method of spin coating a polymer material having a high gas barrier property (for example, polyvinyl alcohol); a method of depositing under a vacuum condition an inorganic thin film (for example, silicon oxide and aluminum oxide), a method to accumulate an organic film (for example, parylene) under vacuum, or a method to laminate these materials in combination.

EXAMPLES

The present invention will be specifically explained with referring to examples below, however, the present invention is not limited thereto.

Example 1

Preparation of Organic Photoelectric Conversion Element 1

With referring to Non-Patent Document 4, Organic photoelectric conversion element 1 of a forward layer structure in which the n-type organic semiconductor material had a concentration gradient as prepared. Only in Organic photoelectric conversion element 1, the first electrode was used as the anode and the second electrode was used as the cathode.

(Formation of the First Electrode)

A transparent conductive film made of indium tin oxide (ITO) was deposited on a substrate composed of PEN to have a thickness of 150 nm. By using a usual photolithography technique and hydrochloric acid etching, a transparent electrode having a pattern of 2 mm width was formed to obtain an anode (the first electrode).

The aforementioned anode which had been subjected to pattern formation was successively cleaned by: ultrasonic cleaning using a surfactant and ultrapure water, and finally ultrasonic cleaning with ultrapure water. Then it was dried by a nitrogen blow, and finally UV light ozone cleaning was performed. The work function of the ITO at this stage was 4.8 eV.

(Formation of Hole Transport Layer)

On the substrate on which the aforementioned anode was formed and then cleaned, Baytron P 4083 (produced by H.C. Starck GmbH) was applied via spin coating so as to have the thickness of 30 nm, and the product was heat dried at 140° C. for 10 minutes in air to obtain a hole transport layer.

Subsequently, the substrate on which the aforementioned hole transport layer was formed was transferred into a glove box in which handling was carried out under a nitrogen atmosphere. First, the aforementioned substrate was subjected to a heat treatment at 140° C. for 10 minutes again. The work function of the hole transport layer was 5.2 eV.

(Formation of Photoelectric Conversion Layer)

A liquid in which 1.0% by mass of the aforementioned p-type material Plexcore OS2100 (P3HT) as a p-type semiconductor material, 0.72% by mass of the aforementioned PCBM as an n-type semiconductor material, and 0.08% by mass of the following comparative compound C were dissolved in chlorobenzene was prepared, and spin coating at 700 rpm for 60 seconds and, subsequently, at 2200 rpm for 1 second was conducted while the liquid was filtered with a 0.45 μm filter, followed by calcinations at 140° C. for 10 minutes, to obtain a photoelectric conversion layer having a thickness of 90 nm.

(Formation of the Second Electrode)

Next, the substrate on which a series of aforementioned organic layers were formed was set in a vacuum deposition equipment without exposing the substrate to the air. After setting the element so that the transparent electrode and the shadow mask of 2 mm width crossed at right angles, and evacuating the inside of the vacuum deposition equipment to $10^{-3}$ Pa or less, 0.6 nm of lithium fluoride and 100 nm of aluminum were vacuum deposited to obtain a cathode (the second electrode). Finally, heating for 30 minutes was performed at 120° C., and, thus, comparative Organic photoelectric conversion element 1 was obtained. The evaporation rate was 2 nm/second, and the size was 2 mm squares. The work function of aluminum is 4.3 eV.

(Sealing)

Thus obtained Organic photoelectric conversion element 1 was sandwiched between two sheets of transparent barrier films GX produced by TOPPAN PRINTING Co., Ltd. (moisture vapor permeability of 0.05 g/m$^2$/d) under a nitrogen atmosphere, sealed by using a UV curable resin (UV RESIN XNR5570-B1 produced by Nagase ChejuteX Corporation), and, then, took out into the air.

Obtained Organic photoelectric conversion element 1 was subjected to evaluation of photoelectric conversion efficiency and durability according to the following methods.

(Measurement of Photoelectric Conversion Efficiency)

Organic photoelectric conversion element 1 which was not sealed after the formation of the second electrode according to the above processes was irradiated with light of an intensity of 100 mW/cm$^2$ from a solar simulator (AM1.5G filter) while a mask having an effective area of 4.0 mm$^2$ was placed on the light receiving section, and the short-circuit current density Jsc (mA/cm$^2$), the open circuit voltage Voc (V), and the curvature factor (fill factor) were measured at four light receiving sections provided on the element. Then, the averages of these values were calculated. The photoelectric conversion efficiency η (%) was determined according to Equation 1 using the Jsc, Voc and FF values. This photoelectric conversion efficiency was defined as the initial photoelectric conversion efficiency.

$$\eta\ (\%) = Jsc(\text{mA/cm}^2) \times Voc(V) \times FF \quad \text{Equation 1}$$

(Durable Measurement)

Aforementioned Organic photoelectric conversion element 1 of which above mentioned sealing was completed was subjected to the measurement of photoelectric conversion efficiency in the same way as described above. This photoelectric conversion efficiency was defined as the initial photoelectric conversion efficiency. While setting the above initial photoelectric conversion efficiency to 100, Organic photoelectric conversion element 1 was stored under a condition of the moisture resistance test B2 described in JIS-C8938 (namely, 85° C. and 85 RH %), and the photoelectric conversion efficiency was periodically measured. The durability was evaluated by using the duration in which the photoelectric conversion efficiency decreased to 80 or less as an index of durability.

[Preparation of Organic Photoelectric Conversion Element 2]

Organic photoelectric conversion element 2 which had a reverse layer structure was prepared with referring to Patent Document 1 (JP-A No. 2009-146981).

(Formation of the First Electrode)

A transparent conductive film made of indium tin oxide (ITO) was deposited on a substrate composed of PEN to have a thickness of 160 nm (the surface resistance was 13Ω/□). By using a usual photolithography technique and hydrochloric acid etching, a transparent electrode having a pattern of 2 mm width was formed to obtain an first electrode which was a transparent electrode. The work function of the first electrode was 4.4 eV.

The aforementioned anode which had been subjected to pattern formation was successively cleaned by: ultrasonic cleaning using a surfactant and ultrapure water, and finally ultrasonic cleaning with ultrapure water. Then it was dried by a nitrogen blow, and finally argon plasma cleaning was performed. The work function of the ITO at this stage was 4.4 eV.

(Formation of Electronic Transport Layer)

Subsequently, the substrate was transferred into a glove box and a 150 in M TiOx precursor solution prepared according to the following procedure was spin coated (a rotation speed of 2000 rpm and a rotation time of 60 s) on the transparent substrate under a nitrogen atmosphere, followed by wiping to a prescribed pattern.

Subsequently, the TiOx precursor was subjected to hydrolysis by leaving the substrate in air. Then, the TiOx precursor was heat treated at 150° C. for one hour to obtain an electron transport layer composed of TiOx and having a thickness of 30 nm. When the elemental composition of TiOx was analyzed using XPS, the x value was found to be approximately 1.68.

<<Preparation of TiOx Precursor: Sol Gel Process>>

First, 12.5 ml of 2-methoxyethanol and 6.25 mmol of titanium tetraisopropoxide were charged into a 100 ml three necked flask, and cooled for 10 minutes in an ice bath. Next, 12.5 mmol of acetylacetone was added slowly and agitated for 10 minutes in an ice bath. Subsequently, the mixed solution was heated at 80° C. for two hours and then refluxed for one hour. Finally, the product was cooled to an ambient temperature and the concentration was adjusted to a prescribed value (150 m) using methoxyethanol to obtain a TiOx precursor. All of the above processes were conducted under a nitrogen atmosphere.

(Formation of Photoelectric Conversion Layer)

A liquid prepared by dissolving 1.0% by mass of P3HT (Plexscore OS2100 produced by Plextronics Inc.) as a p-type semiconductor material, and 0.8% by mass of PCBM (Nanon Spectra E100H produced by) as an n-type semiconductor material in chlorobenzene was spin coated at 700 rpm for 60 seconds and, subsequently, at 2200 rpm for 1 second on the aforementioned electron transport layer while the liquid was filtered with a 0.45 μm filter, followed by drying total adding ratio of ratio p-type organic semiconductor material 1 and p-type organic semiconductor material 2 was the same as the amount of the p-type organic semiconductor material used in the preparation of Organic photoelectric conversion element 2. The structures of Compounds A and B used in the comparative example are as follows.

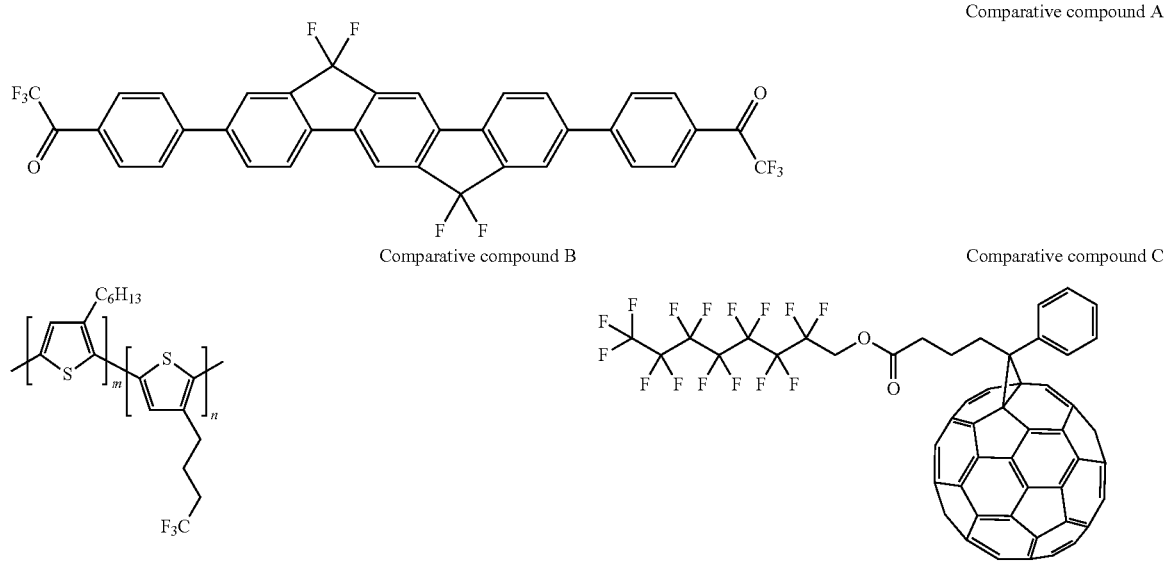

Comparative compound A

Comparative compound B

Comparative compound C for 30 minutes at an ambient temperature to obtain a photoelectric conversion layer having a thickness of 90 nm.
(Formation of Hole Transport Layer)

Next, a hole transport layer was formed by spin coating (2000 rpm, 60 s) a dispersion liquid of organic solvent type PEDOT:PSS (ENOCOAT HC200 produced by Kaken-sangyo (C)) on the organic semiconductor layer, followed by drying by air. The work function of the hole transport layer was 5.2 eV.
(Formation of Second Electrode)

The second electrode was prepared by vacuum evaporating a silver electrode layer on the aforementioned hole transport layer so that the thickness of the layer was 100 nm, followed by heat treating at 150° C. for 10 minutes. Thus Organic photoelectric conversion element 2 of reverse layer structure was prepared. The work function of silver was 4.7 eV.
(Sealing)

Thus obtained Organic photoelectric conversion element 1 was sandwiched between two sheets of transparent barrier films GX produced by TOPPAN PRINTING Co., Ltd. (moisture vapor permeability of 0.05 g/m²/d) under a nitrogen atmosphere, sealed by using a UV curable resin (UV RESIN XNR5570-B1 produced by Nagase ChemteX Corporation), and, then, took out into the air.
[Preparation of Organic Photoelectric Conversion Elements 3-9]

Organic photoelectric conversion elements 3-9 were prepared in the same manner as the preparation of comparative Organic photoelectric conversion element 2 except that the p-type organic semiconductor material and the n-type organic semiconductor material were changed to the composition described in Table 1.

The ratio of p-type organic semiconductor material 1 and p-type organic semiconductor material 2 was a mass, and the Comparative compound A was synthesized with referring to aforementioned Patent Document 2, and Comparative compound B was synthesized with referring to J. Am. Chem. Soc., 2008, p 7812.
[Preparation of Organic Photoelectric Conversion Elements 10-15]

Organic photoelectric conversion elements 10-15 were prepared in the same manner as the preparation of comparative Organic photoelectric conversion element 2 except that the p-type organic semiconductor material was changed to the composition described in Table 1, and the concentration of the total p-type organic semiconductor material was 0.45% by mass, and the concentration of the n-type organic semiconductor material (PCBM) was 1.35% by mass.

Si-PCPDTBT used in the comparative examples and the examples was synthesized with referring to US20080087324.

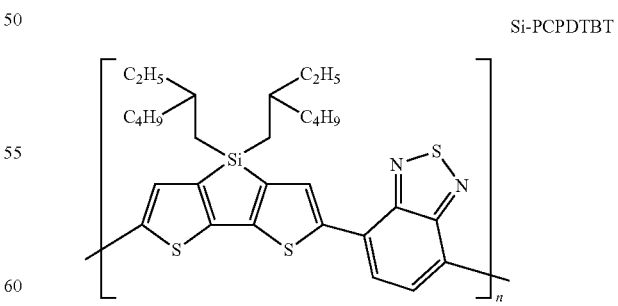

Si-PCPDTBT

Organic photoelectric conversion elements 2 to 13 were subjected to evaluation according to the methods of the aforementioned measurement of photoelectric conversion efficiency and durable measurement. The evaluation results of Organic photoelectric conversion elements 1-15 are shown in Table 1.

TABLE 1

| Organic photoelectric conversion element | p-type organic semiconductor material 1 | | p-type organic semiconductor material 2 | | n-type organic semiconductor material | Fill factor | Photoelectric conversion efficiency | Durability | Remarks |
|---|---|---|---|---|---|---|---|---|---|
| 1 | P3HT | 100% | none | — | PCBM:Comparative compound C = 90%:10% | 65% | 3.20% | 0.75 h | Comparative |
| 2 | P3HT | 100% | none | — | PCBM(100%) | 50% | 2.50% | 67 h | Comparative |
| 3 | P3HT | 100% | none | — | PCBM:Comparative compound C = 90%:10% | 33% | 1.20% | 83 h | Comparative |
| 4 | P3HT | 90% | **A | 10% | PCBM(100%) | 34% | 1.40% | 73 h | Comparative |
| 5 | P3HT | 90% | **B | 10% | PCBM(100%) | 46% | 2.20% | 95 h | Comparative |
| 6 | P3HT | 90% | Exemplified compound 1 | 10% | PCBM(100%) | 55% | 2.80% | 150 h | Inventive |
| 7 | P3HT | 90% | Exemplified compound 2 | 10% | PCBM(100%) | 58% | 3.00% | 160 h | Inventive |
| 8 | P3HT | 90% | Exemplified compound 3 | 10% | PCBM(100%) | 60% | 3.20% | 160 h | Inventive |
| 9 | P3HT | 90% | Exemplified compound 4 | 10% | PCBM(100%) | 63% | 3.30% | 150 h | Inventive |
| 10 | Si-PCPDTBT | 100% | none | — | PCBM(100%) | 40% | 2.40% | 140 h | Comparative |
| 11 | Si-PCPDTBT | 90% | Exemplified compound 25 | 10% | PCBM(100%) | 56% | 3.70% | 180 h | Inventive |
| 12 | Si-PCPDTBT | 90% | Exemplified compound 27 | 10% | PCBM(100%) | 63% | 4.40% | 240 h | Inventive |
| 13 | Si-PCPDTBT | 90% | Exemplified compound 29 | 10% | PCBM(100%) | 60% | 4.00% | 200 h | Inventive |
| 14 | Si-PCPDTBT | 90% | Exemplified compound 42 | 10% | PCBM(100%) | 65% | 4.10% | 220 h | Inventive |
| 15 | Si-PCPDTBT | 90% | Exemplified compound 46 | 10% | PCBM(100%) | 63% | 4.50% | 270 h | Inventive |

**Comparative compound

It is clear from Table 1 that the durability of Organic photoelectric conversion elements 2 to 15, which are of reverse layer structure, are higher than the durability of Organic photoelectric conversion element 1, which is of forward layer structure.

It is also understood that, among the organic photoelectric conversion elements having reversed layer construction, an improved fill factor is obtained when the p-type organic semiconductor material of the present invention is used, whereby an improved photoelectric conversion efficiency can be obtained. Specifically, it is also understood that, the p-type organic semiconductor material containing a branched chain alkyl fluoride group provides a further higher fill factor and photoelectric conversion efficiency.

Example 2

Evaluation of Formation of Hole Transport Layer on Photoelectric Conversion Layer (Preparation of Organic Photoelectric Conversion Element 12″)

Organic photoelectric conversion element 12″ was prepared in the same manner as the preparation of Organic photoelectric conversion element 12 except that the coating of hole transport layer was carried out in a glove box (a nitrogen atmosphere in which oxygen concentration was 10 ppm or less and the dew point was −70° C. or lower), but not in an ambient atmosphere, via a gravure coating method which is more probable in a practical production process.

However, in the extremely dried atmosphere in the glove box, the aqueous solvent in the hole transport layer was repelled and film formation of S three sheets among prepared 5 sheets of organic photoelectric conversion element were unsuccessful.

(Preparation of Organic Photoelectric Conversion Element 15″)

Organic photoelectric conversion element 15″ was prepared in the same manner as the preparation of Organic photoelectric conversion element 15 which was prepared in Example 1, expect that the coating of the hole transport layer was carried out in a glove box (nitrogen atmosphere in which oxygen concentration was 10 ppm or less and the dew point was −70° C. or lower), but not in an ambient atmosphere.

In the case of Organic photoelectric conversion element 15″, even under the extremely dried atmosphere in the glove box, film formation of prepared 5 sheets of organic photoelectric conversion element could be successfully conducted without repelling.

(Evaluation of Organic Photoelectric Conversion Element)

Organic photoelectric conversion elements 12″ and 15″ prepared as described above were evaluated in the same manner as in Example 1.

In the aforementioned coating of the hole transport layers, the number of successfully coated sheets among the 5 organic photoelectric conversion elements (coating property) were shown in Table 2.

TABLE 2

| Organic photoelectric conversion element | p-type organic semiconductor material 1 | | p-type organic semiconductor material 2 | | Coating property | Fill factor | Photoelectric conversion efficiency | Durability | Remarks |
|---|---|---|---|---|---|---|---|---|---|
| 12" | Si-PCPDTBT | 90% | Exemplified compound 27 | 10% | 2 | 63% | 4.2% | 300 h | Inventive |
| 15" | Si-PCPDTBT | 90% | Exemplified compound 46 | 10% | 5 | 65% | 4.5% | 350 h | Inventive |

When Organic photoelectric conversion elements 12 and 12", and Organic photoelectric conversion elements 15 and 15" were compared in Tables 1 and 2, it was found that the durability of the hole transport layer could be further improved by coating under an atmosphere free from moisture or oxygen such as in a glove box. Also, it can be understood that a more preferred coating property can be obtained when a copolymer of a monomer having a fluorinated alkyl group and a monomer having no fluorinated alkyl group, while both the monomers having the same mother moiety, such as Compound 46 of the present invention, is employed. As the results a coating process which is more preferable with respect to durability becomes available.

EXPLANATION OF NUMERALS

10 Organic photoelectric conversion element of bulk heterojunction-type
11 Substrate
12 first electrode
13 second electrode
14 Photoelectric conversion layer
14' first photoelectric conversion layer
15 Charge recombination layer
16 second photoelectric conversion layer
17 Hole transport layer
18 Electron transport layer

What is claimed is:

1. An organic photoelectric conversion element having a reverse layer structure comprising a substrate having thereon at least a first electrode, a photoelectric conversion layer and a second electrode in this order,
wherein the photoelectric conversion layer is a bulk heterojunction layer comprising a p-type organic semiconductor material and a n-type organic semiconductor material, and the p-type organic semiconductor material comprises a compound that has a linear or branched fluorinated alkyl group having 6 to 20 carbon atoms; and
the fluorinated alkyl group is represented by Formula (1)

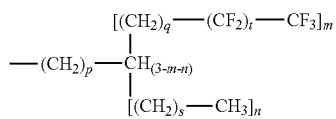

wherein p, q, r, s=0 to 20, m=1 to 3, n=0 to 2, 2≤m+n≤3, and p, q, r, s, m and n each represent an integer.

2. The organic photoelectric conversion element of claim 1, wherein the fluorinated alkyl group has 8 to 20 carbon atoms.

3. The organic photoelectric conversion element of claim 1, wherein Formula (1) meets m≥1 and n≥1.

4. The organic photoelectric conversion element of claim 1, wherein the compound having the fluorinated alkyl group has a substructure represented by Formula (2):

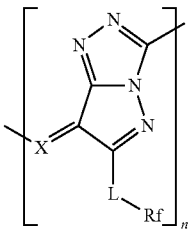

wherein Rf represents the linear or branched fluorinated alkyl group having 6 to 20 carbon atoms, X represents an atom selected from CH and N, and L represents a single bond or a divalent connecting group.

5. The organic photoelectric conversion element of claim 4, wherein, in Formula (2), L represents a carbonyl group, an ester group or an amide group.

6. The organic photoelectric conversion element of claim 4 wherein, in Formula (2), L represents an ester group.

7. The organic photoelectric conversion element of claim 1, wherein at least one fluorinated alkyl group has 7 to 17 fluorine atoms.

8. The organic photoelectric conversion element of claim 1, wherein the compound having the fluorinated alkyl group is a copolymer of a monomer having the fluorinated alkyl group and a monomer having a common mother moiety with the monomer having the fluorinated alkyl group and having no fluorinated alkyl group.

9. The organic photoelectric conversion element of claim 1, wherein the bulk heterojunction layer is formed via a wet process.

10. A solar cell comprising the organic photoelectric conversion element of claim 1.

11. An organic photoelectric conversion element having a reverse layer structure comprising a substrate having thereon at least a first electrode, a photoelectric conversion layer and a second electrode in this order,
wherein the photoelectric conversion layer is a bulk heterojunction layer comprising a p-type organic semiconductor material and an n-type organic semiconductor material, and
the p-type organic semiconductor material comprises a compound that has a linear or branched fluorinated alkyl group having 8 to 20 carbon atoms; and the fluorinated alkyl group is represented by Formula (1)

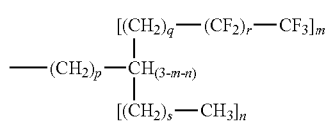

wherein p, q, r, s=0 to 20, m=1 to 3, n=0 to 2, and p, q, r and s each represent an integer;
the p-type organic semiconductor material is composed of a mixture of:
the p-type organic semiconductor compound having the fluorinated alkyl group,
and a p-type organic semiconductor compound without a fluorinated alkyl group,
provided that a ratio of the two compounds is between 1:99 to 30:70; and
wherein Formula (1) meets 3≥m+n≥2.

12. The organic photoelectric conversion element of claim 11, wherein at least one fluorinated alkyl group has 7 to 17 fluorine atoms.

13. The organic photoelectric conversion element of claim 11, wherein the compound having the fluorinated alkyl group is a copolymer of a monomer having the fluorinated alkyl group and a monomer having a common mother moiety with the monomer having the fluorinated alkyl group and having no fluorinated alkyl group.

14. The organic photoelectric conversion element of claim 11, wherein the bulk heterojunction layer is formed via a wet process.

15. A solar cell comprising the organic photoelectric conversion element of claim 11.

16. An organic photoelectric conversion element having a reverse layer structure comprising a substrate having thereon at least a first electrode, a photoelectric conversion layer and a second electrode in this order,
wherein the photoelectric conversion layer is a bulk heterojunction layer comprising a p-type organic semiconductor material and an n-type organic semiconductor material, and
the p-type organic semiconductor material comprises a compound that has a linear or branched fluorinated alkyl group having 8 to 20 carbon atoms; and
the fluorinated alkyl group is represented by Formula (1)

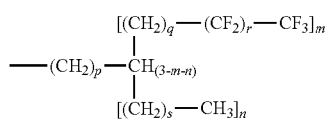

wherein p, q, r, s=0 to 20, m=1 to 3, n=0 to 2, 1≤m+n≤3, and p, q, r and s each represent an integer;
the p-type organic semiconductor material is composed of a mixture of:
the p-type organic semiconductor compound having the fluorinated alkyl group,
and a p-type organic semiconductor compound without a fluorinated alkyl group,
provided that a ratio of the two compounds is between 1:99 to 30:70; and
wherein Formula (1) meets m≥1 and n≥1.

17. The organic photoelectric conversion element of claim 16, wherein at least one fluorinated alkyl group has 7 to 17 fluorine atoms.

18. The organic photoelectric conversion element of claim 16, wherein the compound having the fluorinated alkyl group is a copolymer of a monomer having the fluorinated alkyl group and a monomer having a common mother moiety with the monomer having the fluorinated alkyl group and having no fluorinated alkyl group.

19. The organic photoelectric conversion element of claim 16, wherein the bulk heterojunction layer is formed via a wet process.

20. A solar cell comprising the organic photoelectric conversion element of claim 16.

21. An organic photoelectric conversion element having a reverse layer structure comprising a substrate having thereon at least a first electrode, a photoelectric conversion layer and a second electrode in this order,
wherein the photoelectric conversion layer is a bulk heterojunction layer comprising a p-type organic semiconductor material and an n-type organic semiconductor material, and
the p-type organic semiconductor material comprises a compound that has a linear or branched fluorinated alkyl group having 8 to 20 carbon atoms; and
the fluorinated alkyl group is represented by Formula (1)

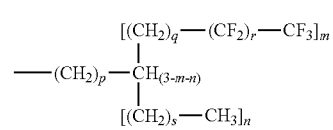

wherein p, q, r, s=0 to 20, m=1 to 3, n=0 to 2, 1≤m+n≤3, and p, q, r and s each represent an integer;
the p-type organic semiconductor material is composed of a mixture of:
the p-type organic semiconductor compound having the fluorinated alkyl group,
and a p-type organic semiconductor compound without a fluorinated alkyl group,
provided that a ratio of the two compounds is between 1:99 to 30:70; and
wherein the compound having the fluorinated alkyl group has a substructure represented by Formula (2):

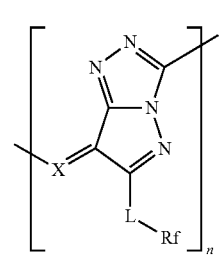

wherein Rf represents the linear or branched fluorinated alkyl group having 6 to 20 carbon atoms, X represents an atom selected from CH and N, and L represents a single bond or a divalent connecting group.

22. The organic photoelectric conversion element of claim 21, wherein in Formula (2), L represents a carbonyl group, an ester group or an amide group.

23. The organic photoelectric conversion element of claim 21, wherein in Formula (2), L represents an ester group.

24. The organic photoelectric conversion element of claim 21, wherein at least one fluorinated alkyl group has 7 to 17 fluorine atoms.

25. The organic photoelectric conversion element of claim 21, wherein the compound having the fluorinated alkyl group is a copolymer of a monomer having the fluorinated alkyl group and a monomer having a common mother moiety with the monomer having the fluorinated alkyl group and having no fluorinated alkyl group.

26. The organic photoelectric conversion element of claim 21, wherein the bulk heterojunction layer is formed via a wet process.

27. A solar cell comprising the organic photoelectric conversion element of claim 21.

* * * * *